(12) United States Patent
Syrkin et al.

(10) Patent No.: US 7,727,333 B1
(45) Date of Patent: Jun. 1, 2010

(54) HVPE APPARATUS AND METHODS FOR GROWTH OF INDIUM CONTAINING MATERIALS AND MATERIALS AND STRUCTURES GROWN THEREBY

(75) Inventors: Alexander L. Syrkin, Montgomery Village, MD (US); Vladimir Ivantsov, Beltsville, MD (US); Alexander Usikov, Gaithersburg, MD (US); Oleg Kovalenkov, Montgomery Village, MD (US); Vladimir A. Dmitriev, Gaithersburg, MD (US)

(73) Assignee: Technologies and Devices International, Inc., Silver Springs, MD (US)

( * ) Notice: Subject to any disclaimer, the term of this patent is extended or adjusted under 35 U.S.C. 154(b) by 255 days.

(21) Appl. No.: 11/692,136

(22) Filed: Mar. 27, 2007

Related U.S. Application Data

(60) Provisional application No. 60/786,327, filed on Mar. 27, 2006, provisional application No. 60/829,093, filed on Oct. 11, 2006.

(51) Int. Cl.
 *C30B 25/14* (2006.01)
(52) U.S. Cl. .................. 117/91; 117/89; 117/95; 117/96; 117/104
(58) Field of Classification Search ............. 117/89, 117/91, 95, 96, 104
 See application file for complete search history.

(56) References Cited

U.S. PATENT DOCUMENTS

| 6,156,581 | A | * | 12/2000 | Vaudo et al. | 438/22 |
| 6,476,420 | B2 | | 11/2002 | Nikolaev et al. | |
| 6,559,038 | B2 | | 5/2003 | Nikolaev et al. | |
| 6,573,164 | B2 | | 6/2003 | Tsvetkov et al. | |
| 6,599,133 | B2 | | 7/2003 | Nikolaev et al. | |
| 6,656,272 | B2 | | 12/2003 | Tsvetkov et al. | |
| 6,660,083 | B2 | | 12/2003 | Tsvetkov et al. | |
| 6,706,119 | B2 | | 3/2004 | Tsvetkov et al. | |
| 6,955,719 | B2 | * | 10/2005 | Dmitriev et al. | 117/91 |
| 2004/0137657 | A1 | * | 7/2004 | Dmitriev et al. | 438/47 |

OTHER PUBLICATIONS

N. Takahashi, et al., "Vapor phase epitaxy of InN using InCl and InCl3 sources," Journal of Crystal Growth, 172 (1997) 2980302.

H. Sunakawa, et al., "Growth of InN by Chloride-Transport Vapor Phase Epitaxy," Japan Journal of Applied Physics, vol. 35(2)-11A, 1996, pp. L1395-L1397.

(Continued)

*Primary Examiner*—Robert M Kunemund
(74) *Attorney, Agent, or Firm*—Vista IP Law Group LLP

(57) ABSTRACT

Hydride phase vapor epitaxy (HVPE) growth apparatus, methods and materials and structures grown thereby. A HVPE growth apparatus includes generation, accumulation and growth zones. A first reactive gas reacts with an indium source inside the generation zone to produce a first gas product having an indium-containing compound. The first gas product is transported to the accumulation zone where it cools and condenses into a source material having an indium-containing compound. The source material is collected in the accumulation zone and evaporated. Vapor or gas resulting from evaporation of the source material forms reacts with a second reactive gas in the growth zone for growth of ternary and quaternary materials including indium gallium nitride, indium aluminum nitride, and indium gallium aluminum nitride.

22 Claims, 29 Drawing Sheets

OTHER PUBLICATIONS

N. Takahashi, et al., "Growth of InN at High Temperature by Halide Vapor Phase Epitaxy" Japan Journal of Applied Physics, vol. 36(2)-6B, 1997, pp. L743-L745.

L.A. Marasina, et al. "Preparation of InN Epitaxial Layers in InCl3-NH3 System", Kristall und Technik, vol. 12, No. 6, 1977, pp. 541-545.

D.Y. Song, et al. "Morphological, electrical, and optical properties of InN grown by hydride vapor phase epitaxy on sapphire and template substrates," Journal of Applied Physics, 99, 116103, Jun. 1, 2006.

J. Kikuchi, et al. "Thermodynamic Analysis of Various Types of Hydride Vapor Phase Epitaxy System for High-Speed Growth of InN," Japanese Journal of Applied Physics, vol. 45, No. 45, Nov. 10, 2006, pp. L1203-L1205.

Ashraful Ghani Bhuiyan, et al. "Indium nitride (InN): A review of growth, characterization and properties," Journal of Applied Physics, vol. 94, Issue 5, Sep. 1, 2003, pp. 2779-2808.

F. Dwikusuma, et al. "Hydride Vapor Phase Epitaxy Growth of Nitrides," Vacuum Science and Technology: nitrides as seen by the technology 2002, pp. 79-103.

Y. Sato, et al. "Growth of InN thin films by hydride vapor phase epitaxy," Journal of Crystal Growth, 144 (1994) pp. 15-19.

Y. Kumagai, et al. "Thermodynamics on tri-halide vapor-phase epitaxy of GaN and $In_xGa_{1-x}N$ using $GaCl_3$ and $InCl_3$," Journal of Crystal Growth 231 (2001) 57-67.

N. Takahashi, et al., "Vapor-phase epitaxy of $In_xGa_{1-x}N$ Using Chloride Sources," Journal of Crystal Growth 189/190 (1998) 37-41).

Y. Sato, et al. "Hydride Vapor Phase Epitaxy of $In_xGa_{1-x}N$ Thin Films," Japanese Journal of Applied Physics, vol. 36 (1997) pp. 4295-4296.

N. Takahashi, et al., "Vapor phase epitaxy of $In_xGa_{1-x}N$ Using $InCl_3$, $GaCl_3$ and $NH_3$ Sources," Japanese Journal of Applied Physics, vol. 36 (1997) pp. L601-L603.

* cited by examiner

X-ray diffraction rocking curve ω-scan for InGaN (00.2) reflection of the layer grown RHEED picture InGaN/GaN/Al$_2$O$_3$ layer. Incident electron beam direction is parallel to [11 $\overline{2}$0] in InGaN. Survey angle is ~1°.

X-ray diffraction spectrum of InGaN/InGaN multi layer structure.

Normalized room temperature PL and EL @ 10 mA of InGaN/p-GaN heterostructure growth by the invented method.

Blue EL of InGaN/p-GaN hetero-junction grown using invented method at different drive currents.

Green EL Normalized Spectrum of InGaN/p-GaN hetero-junction grown using invented method at 180 mA drive currents.

HVPE APPARATUS AND METHODS FOR GROWTH OF INDIUM CONTAINING MATERIALS AND MATERIALS AND STRUCTURES GROWN THEREBY

CROSS-REFERENCE TO RELATED APPLICATIONS

This application claims the benefit under 35 U.S.C. §119 to U.S. Provisional Application Ser. No. 60/786,327, filed on Mar. 27, 2006, and to U.S. Provisional Application Ser. No. 60/829,093, filed on Oct. 11, 2006, the contents of which are incorporated herein by reference.

FIELD OF THE INVENTION

The present inventions relate generally to methods and systems for fabricating group III nitride materials and resulting materials and semiconductor devices and, more particularly, to fabrication methods and systems using hydride vapor phase epitaxy (HVPE).

BACKGROUND

Group III-N nitride compounds and their alloys have been developed for various optoelectronic and electronic applications. For example, GaN, AlN, AlGaN, InN, InGaN, InAlN and InGaAlN have physical and electronic properties that make them ideal candidates for various electronic and optoelectronic devices. These materials exhibit a direct band gap structure, high electric breakdown field, and high thermal conductivity, which make them suitable for devices including high brightness light emitting diodes (LEDs) with high internal quantum efficiency (IQE) and have a variety of important applications.

Additionally, ternary alloy compounds or materials such as $In_xAl_{1-x}N$ and $In_xGa_{1-x}N$ can be used to cover a wide range of band gap energies from about 0.7 eV (where x equals 1) to 6.2 eV (where x equals 0) and from about 0.7 to 3.4 eV, respectively. Quaternary compounds or materials, such as $In_x Ga_y Al_{1-x-y}N$, are also of interest as certain compositions can provide lattice matched pairs for GaN and other binary and ternary nitride compounds for reducing defect densities in nitride based hetero-structures.

One method of growing such materials is metal organic chemical vapor deposition (MOCVD) techniques. With MOCVD, group III-V compounds are grown from the vapor phase using metal organic compounds as sources of the Group III metals. Trimethylindium (TMI) is typically used as an indium source material, trimethylaluminum (TMA) is used as an aluminum source material and trimethylgallium (TMG) is used as a gallium source material. Ammonia gas is typically used as a nitrogen source. Materials are supplied to a MOCVD reactor from external source tanks Inside the MOCVD reactor, a metal organic material source reacts with ammonia resulting in deposition of an epitaxial layer of a nitride material on a substrate. In order to control the electrical conductivity of grown materials, electrically active impurities are introduced into the reaction chamber during material growth. Undoped III-V compounds normally exhibit n-type conductivity. Donor impurities such as silicon or germanium are used to control n-type conductivity. Magnesium impurities are usually used in the form of metal organic compounds to control p-type conductivity.

MOCVD has been used to fabricate p-type III-N materials, and a variety of semiconductor devices employing both p-n and p-i-n junctions have been demonstrated including light emitting diodes (LEDs), laser diodes (LDs), photo-detectors, and transistors. High brightness LEDs and blue and ultraviolet (UV) lasers have been demonstrated based on group III nitride multi layer epitaxial structures including single or multiple quantum wells and quantum dots.

In many of these devices, indium-containing alloy materials including InGaN and InGaAlN are the main components of the active regions. For example, light emitting regions of high brightness blue LEDs and LDs are typically made from InGaN alloys, in particular, InGaN quantum well structures. Parameters of the devices can be controlled by changing alloy compositions. For example, for blue LEDs, the InN content in the InGaN light emitting region may be about 15 mol. %, whereas InN content of about 25 mol. % is required for green LEDs.

MOCVD has also been used to produce technology capable of producing multi-layer hetero-structures that are used for electronic or optoelectronic devices. Typical structures include AlGaN/GaN hetero-structures for high frequency transistors and AlGaN/InGaN/GaN pn hetero-structures for light emitting devices. An important elements of these structures are quantum well structures, which are hetero-structures having thicknesses of separate layers of several nanometers. In such structures, light emitting efficiency may be increased due to quantum effects taking place in nanometer thick epitaxial layers comprising hetero-junctions.

Although MOCVD has been used in the past, this fabrication method has a number of limitations. Significantly, grown materials suffer from high defect densities, poor conductivity or doping control, and non-uniformity. For example, green LEDs based on InGaN alloy materials with relatively high InN content (more than 20 mol. %) fabricated by MOCVD show low efficiency and output power, and nitride-based yellow and red LEDs require even higher InN content and currently are not commercially available due to poor performance. Such poor material characteristics limit the applicability of such materials, and the resulting structures may not be suitable for applications such as high speed communication THz electronics, solar sells, and advanced sensors. Further, success in controlling p-type conductivity in nitride materials is limited to use of GaN and to some extent, AlGaN and InGaN alloys with low AlN and InN content, respectively. Other limitations of MOCVD include high fabrication costs resulting from high costs source materials, low deposition rates and complicated growth procedures and apparatuses. MOCVD requires operations in a high vacuum environment and the associated pumping processes and machinery. Further, deposition rates achieved by MOCVD typically do not exceed one or two microns per hour, thus limiting the thickness of deposited materials and rendering MOCVD unsuitable for bulk growth.

It is also known to grow such materials using Molecular Beam Epitaxy (MBE). MBE, however, suffers many of the same shortcomings as MOCVD. For example, MBE involves high fabrication costs and operation in a vacuum environment. Further, MBE techniques also suffer from slow deposition rates, which limit the thicknesses of materials grown by MOCVD and limit or prohibit effective bulk growth.

Hydride vapor phase epitaxy (HVPE) has also been investigated for the fabrication of III-V nitride materials. With HVPE, gallium and aluminum metals are typically used as source materials for GaN and AlN HVPE growth, respectively. HVPE can be performed at atmospheric pressure, thus eliminating the need for vacuum processes and equipment of other systems. HVPE is also convenient for mass production of semiconductor materials and devices due to its low cost, excellent material characteristics, flexibility of growth conditions, and good reproducibility.

HVPE also offers advantages in material quality (low defect density), growth rate, controllable doping, process and equipment simplicity, and low fabrication cost. High deposition rates of about 200 microns per hour are characteristic for bulk growth of GaN and AlN materials with high crystalline quality. It is known that for nitride materials grown on foreign substrates (e.g. sapphire), defect densities rapidly decrease with layer thickness. The ability to deposit from 10 to 100 microns thick layers and subsequently reduce defect densities by orders of magnitude provides significant advantages over MOCVD and MBE.

Published results on HVPE growth of InGaN materials are limited, and limited data on HVPE growth of InGaAlN is available. InGaN layers grown using HVPE were demonstrated in 1997 by Takahashi et al. In this study, growth was performed from $InCl_3$ and $GaCl_3$ as initial group III materials sources and ammonia as the nitrogen source. All of the source materials were pre-synthesized outside of the reactor and placed inside the reactor without reaction with a reactive gas, such as HCl gas. Optical or structural properties of grown material were not reported.

In another study by Sato et al., HVPE growth of InGaN layers was performed using indium and gallium metals that were placed in a source zone in the same HCl flow channel. The gas resulting from the reaction of indium and gallium metals in the source zone was provided directly to a growth zone, and growth was carried out using ammonia. Growth temperatures ranged from 520° to 1010° C. Growth rates up to 1.5 microns/hour were observed. Grown InGaN layers had weak and broad photo luminescence (PL). A weak PL peak was observed at around 430-440 nm.

While growth of InGaN has been performed in the past, growth of device quality indium-containing alloy materials such as InGaN alloys has not been successfully demonstrated, e.g., due to impurities in externally generated or pre-synthesized source materials. For example, in one study, the smallest value of the full width at half maximum (FWHM) of x-ray rocking curves using prior HVPE methods is about 1482 arc seconds for the (00.2) InN peak. X-ray rocking curve data for the (10.2) InN reflection, which can be measured only for high crystal quality materials, was not reported.

Accordingly, it would be desirable to have HVPE reactors and growth methods capable of growing high quality, low defect density indium-containing nitride materials and structures, such as InGaN and InGaAlN. Further, it would be desirable to be able to grow such materials and structures throughout their composition ranges. Additionally, it would be desirable to grow high quality materials and structures with greater thicknesses than known systems. It would also be desirable to be able to generate and collect source materials inside a HVPE reactor so that source material properties are defined by initial materials in order to reduce or prevent source material contaminants resulting from generation in and/or introduction of source materials from an external environment.

SUMMARY

In accordance with one embodiment, a method of growing an epitaxial layer in a hydride vapor phase epitaxy reactor includes generating a source material having a compound including indium. The source material is generated inside of the reactor. The method also includes collecting the source material inside the reactor and growing an epitaxial layer including indium and at least two other elements using collected source material.

According to another embodiment, a method of growing a multi-layer epitaxial structure in a hydride vapor phase epitaxy reactor includes generating a source material having a compound including indium. The source material is generated inside the reactor. The method also includes collecting the source material inside the reactor. The method further includes growing a first epitaxial layer using collected source material, the first epitaxial layer having a first composition and growing a second epitaxial layer on the first epitaxial layer using collected source material, the second epitaxial layer having a second composition that is different from the first composition.

In a further embodiment, a method of growing an epitaxial layer in a hydride vapor phase epitaxy reactor includes generating a first source material having a compound including indium and generating a second source material having a compound including gallium. The first and second source materials are generated inside the reactor. The method also includes collecting the first and second source materials inside the reactor. The method further includes growing an epitaxial layer including indium and gallium using collected first and second source materials.

In another embodiment, a method of growing an epitaxial layer in a hydride vapor phase epitaxy reactor includes generating a first gas product resulting from a reaction of a first reactive gas and indium. The method also includes condensing the first gas product to generate a liquid source material having a compound including indium. The method further includes collecting the liquid source material in a vessel positioned inside the reactor, evaporating collected liquid source material, and growing an epitaxial layer including indium and at least two other elements by a reaction of a second reactive gas and a second gas product resulting from evaporation of collected liquid source material.

In a further alternative embodiment, a method of growing an epitaxial layer in a hydride vapor phase epitaxy reactor includes generating a first gas product resulting from a reaction of a first reactive gas and indium and generating a second gas product resulting from a reaction of the first reactive gas and gallium. The method also includes generating a liquid first source material having a compound including indium by condensing the first gas product, and generating a solid second source material having a compound including gallium by condensing the second gas product. The liquid and solid source materials are generated inside the reactor. The method further includes collecting the liquid first source material in a first vessel positioned inside the reactor and collecting the solid second source material in a second vessel positioned inside the reactor. The method also includes evaporating collected first source material, thereby generating a third gas product, and evaporating collected second source material, thereby generating a fourth gas product. An epitaxial layer is grown by a reaction of a second reactive gas and the third and fourth gas products.

In one or more embodiments, one or multiple source materials can be generated and collected inside the reactor. Alternatively, at least one source material is generated and collected inside of the reactor, and one or more other source materials are generated and introduced from an external environment.

An internally generated source material can include indium (e.g., $InCl_3$), which can be an indium-containing source material in the form of a liquid. An internally generated source material can include gallium (e.g., $GaCl_3$), which can be a gallium-containing source material in the form of a solid or a liquid. An internally generated source material can also include aluminum, which may also be a solid or a liquid.

Embodiments can be used to grow a single epitaxial layer or multiple epitaxial layers. A structure including multiple epitaxial layers can have different compositions, e.g. different indium nitride contents. Grown layers can, e.g., be indium gallium nitride, indium aluminum nitride, and indium aluminum gallium nitride. A full width at half maximum (FWHM) of an x-ray ω-scan rocking curve for grown indium gallium nitride can be less than 800 arc seconds for a (00.2) peak. Embodiments can also be used for continuous growth of different layers (e.g., having different compositions) during a single epitaxial run by altering a parameter, such as temperature of a collected source material inside the reactor. Embodiments can also be used for bulk growth of single crystalline materials. Growth is also performed in the absence of hydrogen chloride gas.

DETAILED DESCRIPTION OF ILLUSTRATED EMBODIMENTS

Embodiments provide HVPE growth reactors, fabrication methods and high quality, low defect density ternary and quaternary materials containing indium and related semiconductor structures that are fabricated using at least one internally generated source material. Embodiments advantageously generate and collect one or multiple source materials inside a HVPE reactor (i.e. insulated or isolated from the external environment) rather than relying solely on pre-synthesized that are generated outside of the reactor and introduced into the reactor from the external environment. In one embodiment, an indium-containing gas is transported from a growth zone inside the reactor to an accumulation zone inside the reactor where it condenses into an indium-containing liquid. The liquid is collected in a vessel or container in the accumulation zone. Liquid that is collected evaporates, and the resulting source material gas containing indium is transported from the accumulation zone to a growth zone. In the growth zone, the source material reacts with a reactive gas for growth of high quality ternary and quaternary materials containing indium.

Embodiments can be used to grow high quality indium-containing nitride materials including InGaN, InAlN, and InGaAlN. Improved material qualities achieved with embodiments are reflected in narrower widths of x-ray diffraction rocking curves. For example, indium gallium nitride materials grown with embodiments had a full width at half maximum (FWHM) x-ray ω-scan rocking curve that is less than 800 arc seconds (e.g., less than 500 arc seconds) for the (00.2) peak using ω-scan geometry. Improved material quality was also demonstrated by results of room temperature optical characterization of grown materials.

In addition to improved material quality, embodiments advantageously eliminate the need for vacuum equipment since HVPE apparatus embodiments operate at atmospheric pressure. Embodiments also provide high deposition rates and growth of high quality materials in the absence of HCl gas. Further, embodiments allow one or multiple internally generated source materials to be controllably moved inside the reactor so that source materials can be properly positioned to adjust temperature and gas parameters and achieve desired growth. Aspects of embodiments are described with reference to FIGS. 1-35.

Figure 1:
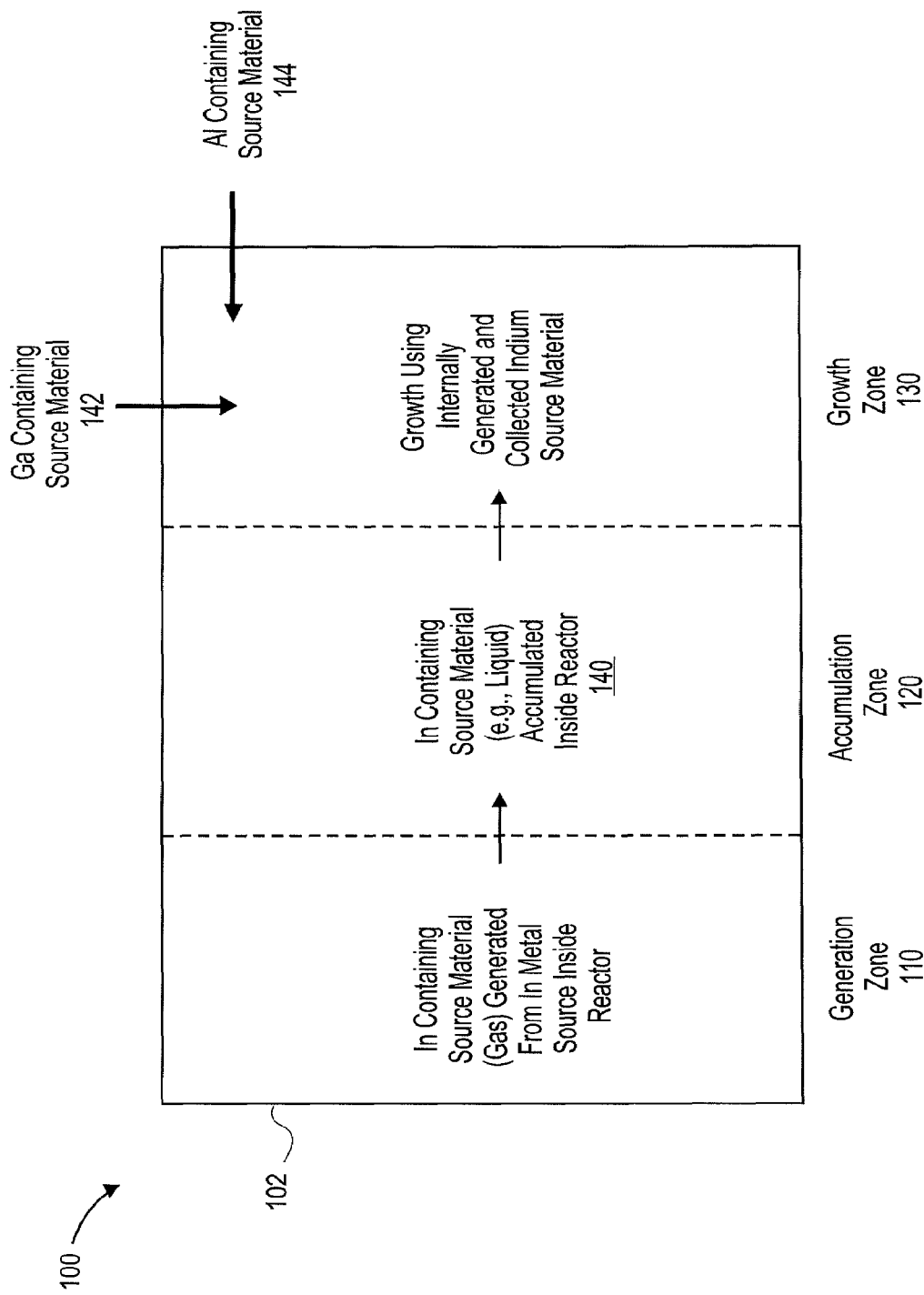
FIG. 1 is a block diagram generally illustrating a HVPE apparatus for generating and accumulating an indium source material inside the reactor according to one embodiment.

FIG. 1 is a system block diagram that generally illustrates a HVPE reactor or growth apparatus 100 (generally reactor 100) according to one embodiment and having an outer wall or flange 102 and three internal zones—a generation zone 110, an accumulation or collection zone 120, and a growth zone 130. In one embodiment, indium source material 140 is advantageously produced and collected inside the reactor 100, thereby allowing production of higher purity source materials, thus eliminating the need to provide pre-synthesized indium source materials from an external environment and eliminating contaminants associated with pre-synthesized source materials.

The reactor 100 can be a hot wall quartz tube reactor having a resistively heated furnace (not shown in FIG. 1). The outer wall or tube 102 may have vertical, horizontal (as shown in FIG. 1), or combined vertical-horizontal geometry with a cylindrical or other cross-sectional shape, such as a rectangular cross-section. In the illustrated embodiment, the reactor 100 includes three zones 110, 120 and 130 that are defined by reference or dividing lines. In practice, the zones 110, 120 and 130 can be defined by different temperatures or temperature distribution profiles. Further, zones 110, 120 and 130 can be defined by other suitable technical parameters. For example, the growth apparatus 100 can be a multi-zone resistive heater furnace having one or more heating elements that at least partially surround the reactor. The heating elements can be independently controllable to provide different temperature profiles and zones inside the reactor 100. Thus, each zone 110, 120 and 130 inside the growth apparatus 100 has a particular temperature profile for different stages of material growth.

As generally illustrated in FIG. 1, a high purity indium-containing source material 140 is generated and collected inside the reactor 100. An indium source metal in the generation zone 110 reacts with a gas resulting in an indium-containing source gas, which is transported to the accumulation zone 120. The gas condenses into a liquid and/or solid indium source material 140 that is collected in the accumulation zone 120. The liquid and/or solid indium source material 140 evaporates and is transported to the growth zone 130. A gallium containing source material 142 and/or an aluminum containing source material 144 (which can be pre-synthesized or generated outside of the reactor 100) can also be introduced into the growth zone 130 for growth of high quality ternary and quaternary indium-containing materials.

According to one embodiment, an indium-containing source material 140 is generated and collected inside the reactor 100, and a pre-synthesized gallium-containing source material 142 (e.g., GaCl3 powder) is introduced from outside of the reactor 100 and into the growth zone 130. According to another embodiment, an indium-containing source material 140 is generated and collected inside the reactor 100, and a pre-synthesized aluminum-containing source material 144 is introduced from outside of the reactor 100 and into the growth zone 130. According to another embodiment, an indium-containing source material 140 is generated and collected inside the reactor 100, and a pre-synthesized gallium containing source material 142 and a pre-synthesized aluminum containing source material 144 are introduced from outside of the reactor 100 and into the growth zone 130. In other embodiments pre-synthesized source materials may be located inside the reactor in separate source zones.

Figure 2:
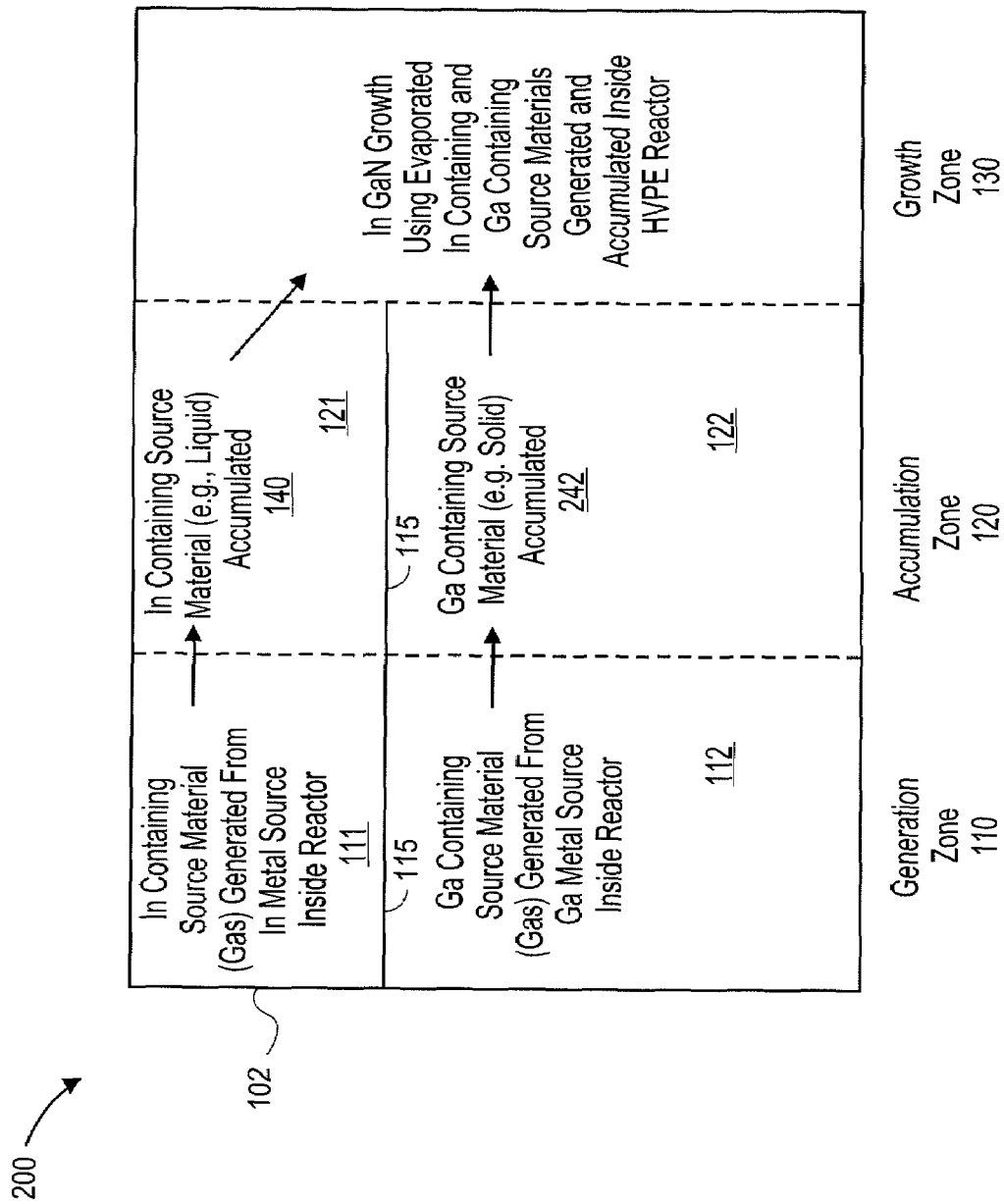
FIG. 2 is a block diagram generally illustrating a HVPE apparatus for generating and accumulating indium and gallium source materials inside the reactor according to one embodiment.
Figure 3:
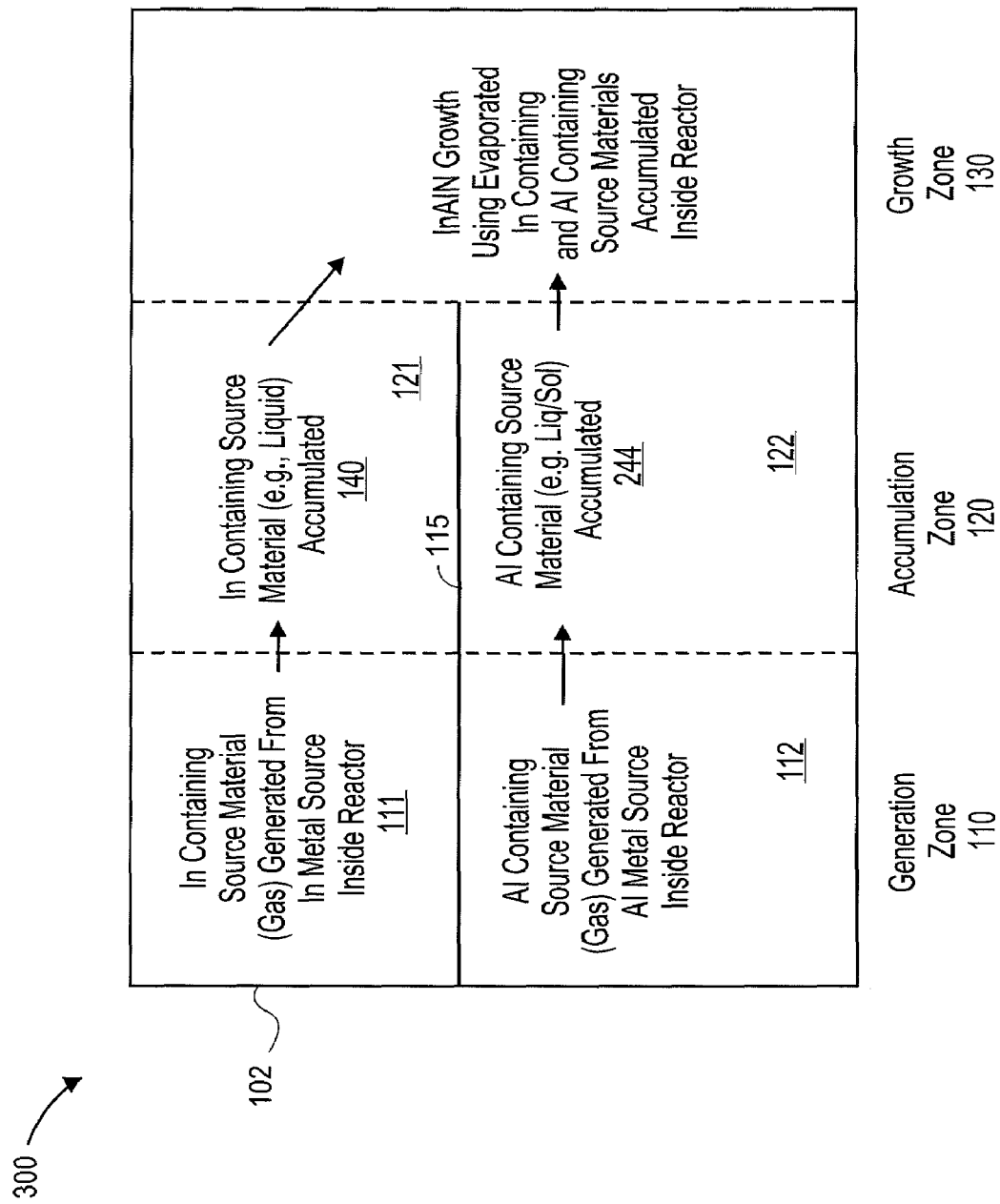
FIG. 3 is a block diagram generally illustrating a HVPE apparatus for generating and accumulating indium and aluminum source materials inside the reactor according to one embodiment.

Referring to FIGS. 2 and 3, in another embodiment, multiple source materials are generated and collected inside the reactor 100. If necessary, the generation zone 110 can include multiple sections (generally illustrated as sections 111 and 112) that may include different temperatures and/or temperature profiles. In the illustrated embodiment, the generation zone 110 is divided into two sections 111 and 112 by a wall 115 or other suitable divider to provide suitable temperatures or temperature profiles inside the generation zone 110. Similarly, the accumulation zone 120 can be divided into two sections 121 and 122 with a wall 125 or other suitable divider to provide suitable temperatures or temperature profiles inside the collection zone 120.

For example, as shown in FIG. 2, an indium-containing source material 140 is generated and collected in sections 111 and 121 of the generation and collection zones 110 and 120 inside of the reactor 200, and a gallium containing source material 242 is generated and collected in sections 112 and 122 of the generation and collection zones 110 and 120 inside of the reactor 200. The two source materials 140 and 242 are both provided to the growth zone 130 for growth of a material, e.g., indium gallium nitride.

As a further example, as shown in FIG. 3, an indium-containing source material 140 is generated and collected in sections 111 and 121 of the generation and collection zones 110 and 120 inside of the reactor 300, and an aluminum containing source material 344 is generated and collected in sections 112 and 122 of the generation and collection zones 110 and 120 inside of the reactor 300. The source materials 140 and 344 are both provided to the growth zone 130 for growth of a material, e.g., indium aluminum nitride.

Figure 4:
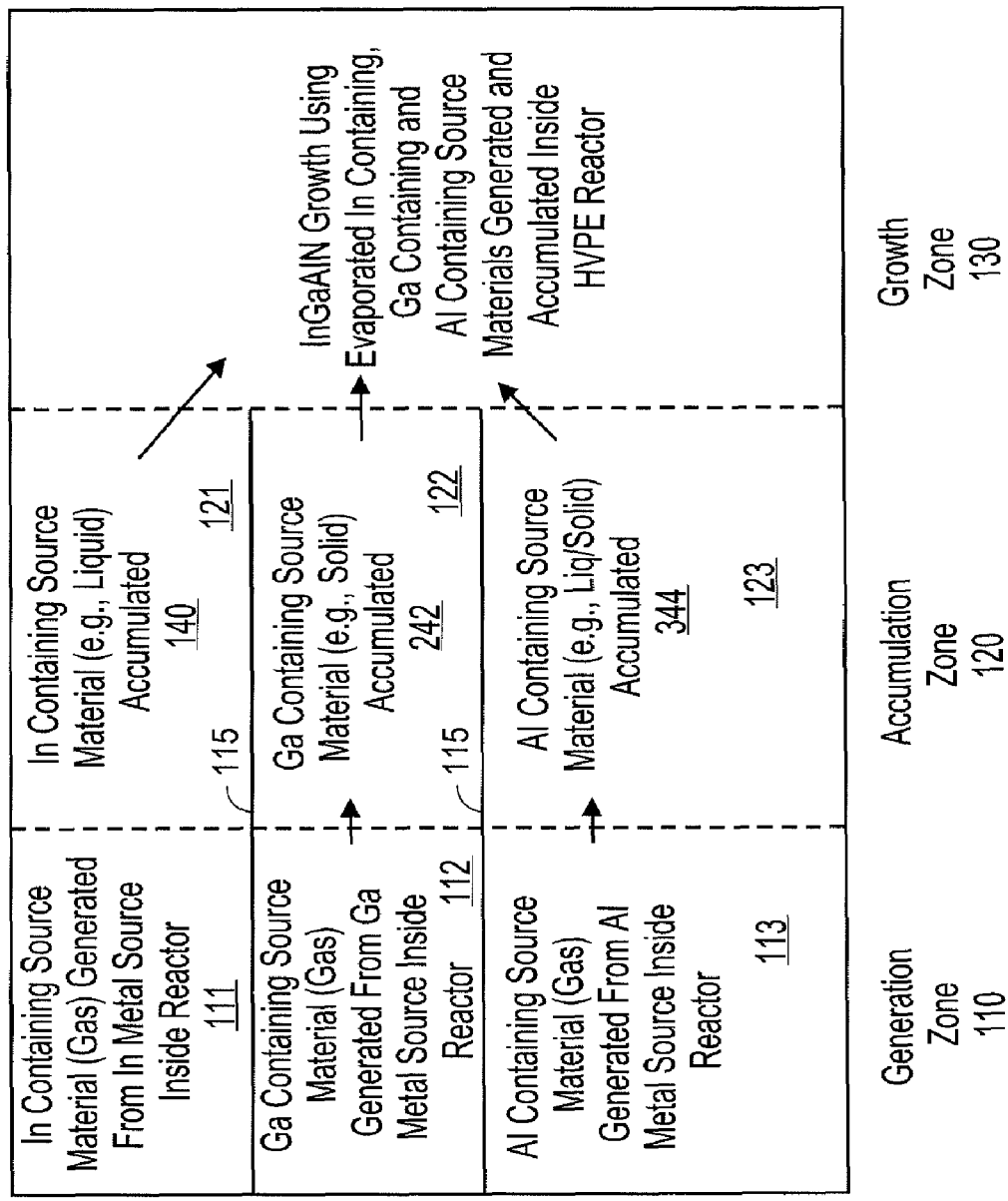
FIG. 4 is a block diagram generally illustrating a HVPE apparatus for generating and accumulating indium, gallium and aluminum source materials inside the reactor according to one embodiment.

Referring to FIG. 4, in a further embodiment, more than two source materials, e.g., three source materials, can be generated and collected inside of the reactor 400. In the illustrated embodiment, an indium-containing source material 140 is generated and collected in sections 111 and 121 of the generation and collection zones 110 and 120 inside of the reactor 400, a gallium containing source material 242 is generated and collected in sections 112 and 122 of the generation and collection zones 110 and 120 inside of the reactor 400, and an aluminum containing source material 344 is generated and collected in sections 113 and 123 of the generation and collection zones 110 and 120 inside of the reactor 400. The source materials 140, 242 and 344 are provided to the growth zone 130 for growth of a material, e.g., indium gallium aluminum nitride.

Embodiments illustrated in FIGS. 1-4 illustrate that at least one source material, multiple source materials, or all source materials can be generated and collected inside the reactor. In embodiments in which some source materials are internally generated and collected, one or more other source materials can be pre-synthesized and introduced from an external environment.

Preferably, at least the indium source material 140 is generated and collected inside of the reactor to provide a desired level of improved material quality. Applicants have determined experimentally that an internally generated and collected indium source material 140 has the largest impact on enhanced material quality. Thus, an internally generated and collected indium source material 140 can be used with one or more other source materials (e.g., gallium and/or aluminum source materials 242 and 344) that are also internally generated and collected to produce materials with the highest purity. Alternatively, an internally generated and collected indium source material 140 can be used with one or more other source materials (e.g., gallium and/or aluminum source materials) that are pre-synthesized and introduced into the growth zone from outside of the reactor, resulting in growth of materials having purities that are higher than materials grown with known systems and methods. FIGS. 5-16 illustrate reactor and method embodiments in further detail, and FIGS. 17-35 illustrate materials and structures grown by embodiments and properties thereof.

Figure 5:
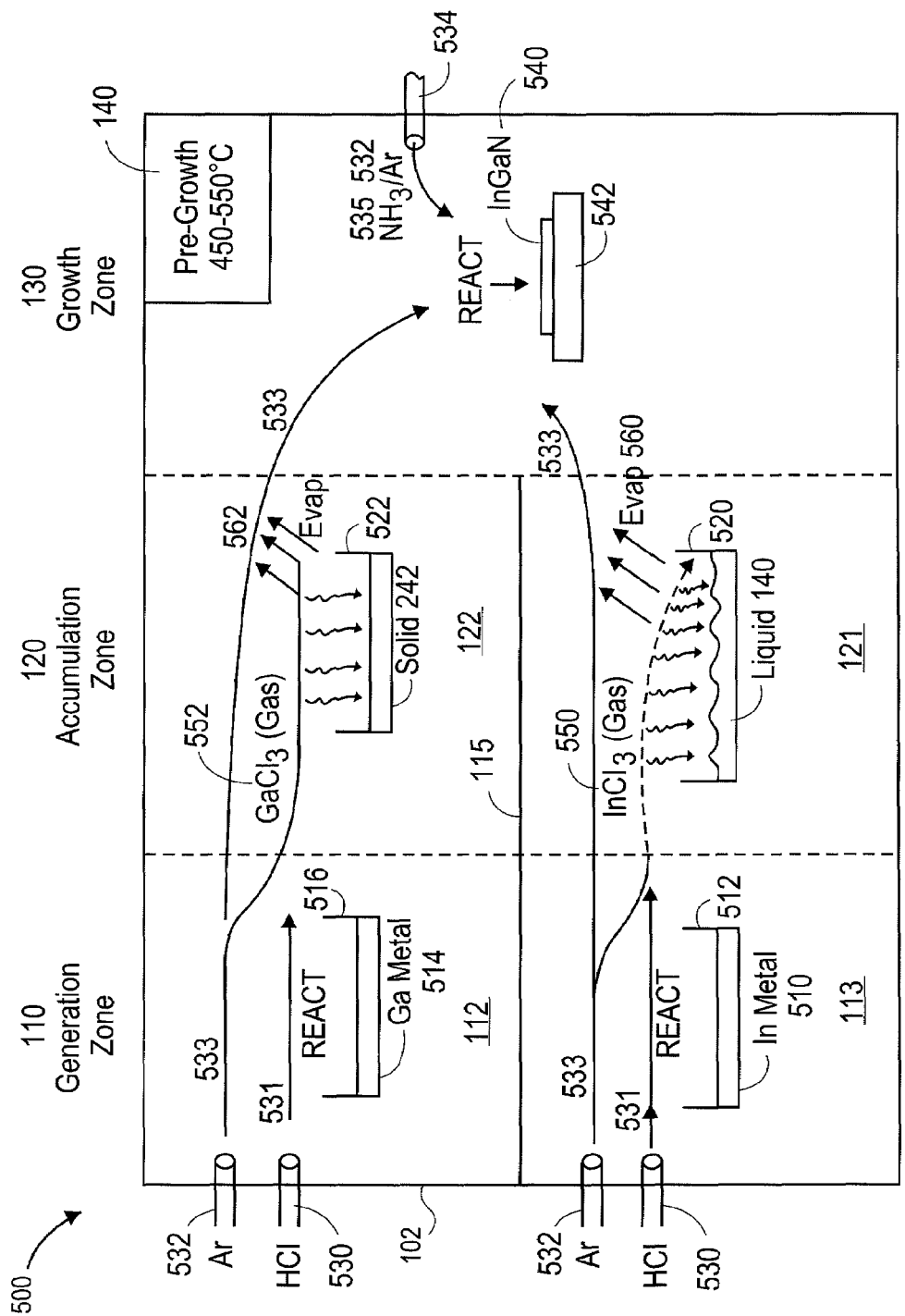
FIG. 5 is a system flow diagram illustrating a HVPE apparatus configured for generating and accumulating an indium source material inside the reactor and for growing indium gallium nitride according to one embodiment.

FIG. 5 is a system flow diagram that further illustrates a HVPE reactor 500 that is configured as shown in FIG. 2 (internally generated indium-containing and gallium-containing source materials). The reactor 500 includes a generation zone 110, an accumulation zone 120 and a growth zone 130 and, if necessary, a pre-growth zone 140. The pre-growth zone can be used to pre-heat substrates 542 before growth. With embodiments, epitaxial growth is performed at atmospheric pressure in a hot wall quartz tube reactor with a resistively heated furnace. However, apparatus and method embodiments can be implemented, if desired, at pressures other than atmospheric pressures using different reactors.

In the illustrated embodiment, the generation zone 110 has two sections—a first section 111 that includes indium metal 510 held in one or more indium boats 512 (one boat 512 is illustrated) and a second section 112 that includes gallium metal 514 held in one or more gallium boats 516 (one boat 516 is illustrated). Embodiments can be implemented using one or multiple indium boats 512 and one or multiple gallium boats 516, e.g., for simultaneous growth of different indium gallium nitride layers on different substrates 542. The accumulation zone 120 includes two sections—a first section 121 that includes a first vessel or container 520 for collecting indium source material 140 and a second section 122 that includes a second vessel or container 522 for collecting gallium source material 242. The first vessel 520 and second vessel 522 are in different positions inside the accumulation zone 120 inside the reactor 500. The sections 111 and 112, and 121 and 122, are separated by a wall 115 or other suitable divider.

The indium metal and gallium metal boats 512 and 516 can be various materials and sizes. For example, the indium metal boat 512 can be quartz, graphite, silicon carbide or other suitable materials and have a volume of about 20 to 100 cm, e.g., about 20 to 50 cm$^3$, and the gallium metal boat 516 can be quartz and have a volume of about 20 to 200 cm$^3$. The accumulation containers or vessels 520 and 522 (generally "vessels") can be made of any material inert to halides of group III metals (e.g. quartz, sapphire, silicon carbide). The vessels 520 and 522 should have sufficient volume to accommodate the generated liquid or solid chloride source materials 140 and 242. For example, the vessels 520 and 522 can have an elongated shape and volumes as discussed above so that sufficient surface areas of the collected source materials 140 and 242 collected in the vessels 520 and 522 are exposed to facilitate evaporation of the source materials 140 and 242 when growth is to be performed. In one embodiment, the vessels 520 and 522 can be fixed inside the reactor 500. Alternatively, one or multiple or all of the vessels can be controllably moveable inside the reactor 500. For example, a vessel can be moveable to different locations within the accumulation zone 120 in order to position the source material in a particular location to achieve desired growth.

Various inlets, channels, tubes or other suitable conduits (generally referred to as a "source" or "source tube") are provided for introducing gases into the reactor 500 for generation, collection and growth stages. One or more source tubes 530 extend through a flange 102 of the reactor 500 and provide a reactive gas 531, such as HCl gas, to the generation zone 110. One or more source tubes 532 extend through the flange 102 and provide an inert or carrier gas 533, such as argon, nitrogen or a nitrogen-argon mixture, to one or more or all of the zones in the reactor 500. One or more source tubes 534 extend through the flange 102 and provide a reactive gas 535, such as ammonia, to the growth zone 130 for growth of nitride materials.

Although this specification refers to ammonia as a reactive gas 535 in the growth zone 130 for growth of nitride materials, embodiments can be used with other reactive gases 535 for growth of other materials. For example, the reactive gas 535 can be $PH_3$ gas, which can be used as a source of phosphorous for growth of materials such as InGaP. This specification refers to ammonia as a reactive gas for growth of nitride materials (e.g., InGaN) as one example of how embodiments can be implemented for growth of nitride materials.

Source tubes can have a cylindrical cross-section and other shapes and sizes. Further, source tubes can extend through different sides of the reactor 500. Moreover, source tubes can have a suitable length so that the gas provided by the source tube is delivered to the appropriate zone inside the reactor 500. Thus, a single source tube can supply a gas to a single zone or multiple zones inside the reactor 500. Further, a single source tube can supply a gas to a single section of a zone or multiple sections of a zone inside the reactor 500. For example, source tube 530 can supply HCl gas 531 to each section 111 and 112 in the generation zone 110 and/or to each section 121 and 122 in the accumulation zone 120. Thus, it should be understood that embodiments can be implemented using various reactor and source tube configurations.

The reactor 500 can also include other source tubes (not illustrated in FIG. 5) that provide donor and acceptor impurities for doping grown materials to produce n-type, p-type, and i-type epitaxial layers, multi layers structures and bulk materials. The dopants can also be used to control electrical and optical properties. For example, source tubes may provide metallic or metal organic sources of Mg or Zn to grow p-type materials, and other source tubes may provide zinc or iron dopants for growing insulating (i-type) materials. Other dopants that can be introduced into the reactor include Si, Ge, O and C dopants.

Material deposition (growth) 540 is performed on one or multiple heated substrates 542. FIG. 5 illustrates one substrate 542, but embodiments can be implemented using multiple substrates 542, e.g., for simultaneous growth on multiple substrates). Substrates 542 can be composed of various materials such as sapphire, InN, SiC, Si, GaN, AlN, AlGaN, GaAs and other suitable substrate materials. Further, substrates 542 can be template or engineered substrates such as GaN/sapphire template substrates, AlN/sapphire template substrates, InN/GaN/sapphire template substrates, InGaN/GaN/sapphire template substrates. The substrates 542 can be well oriented parallel to a crystallographic plane or they may be mis-oriented at an angle varying from 0 to 90 degrees. Substrates 542 can be various sizes to provide growth of epitaxial layers having various diameters. For example, substrates 542 may be 2-inch, 3-inch, 4-inch, and larger. This specification refers to a sapphire or GaN/sapphire template substrate 542 as examples of suitable substrates 542 and persons skilled in the art will appreciate that various substrates 542 can be utilized.

Figure 6:
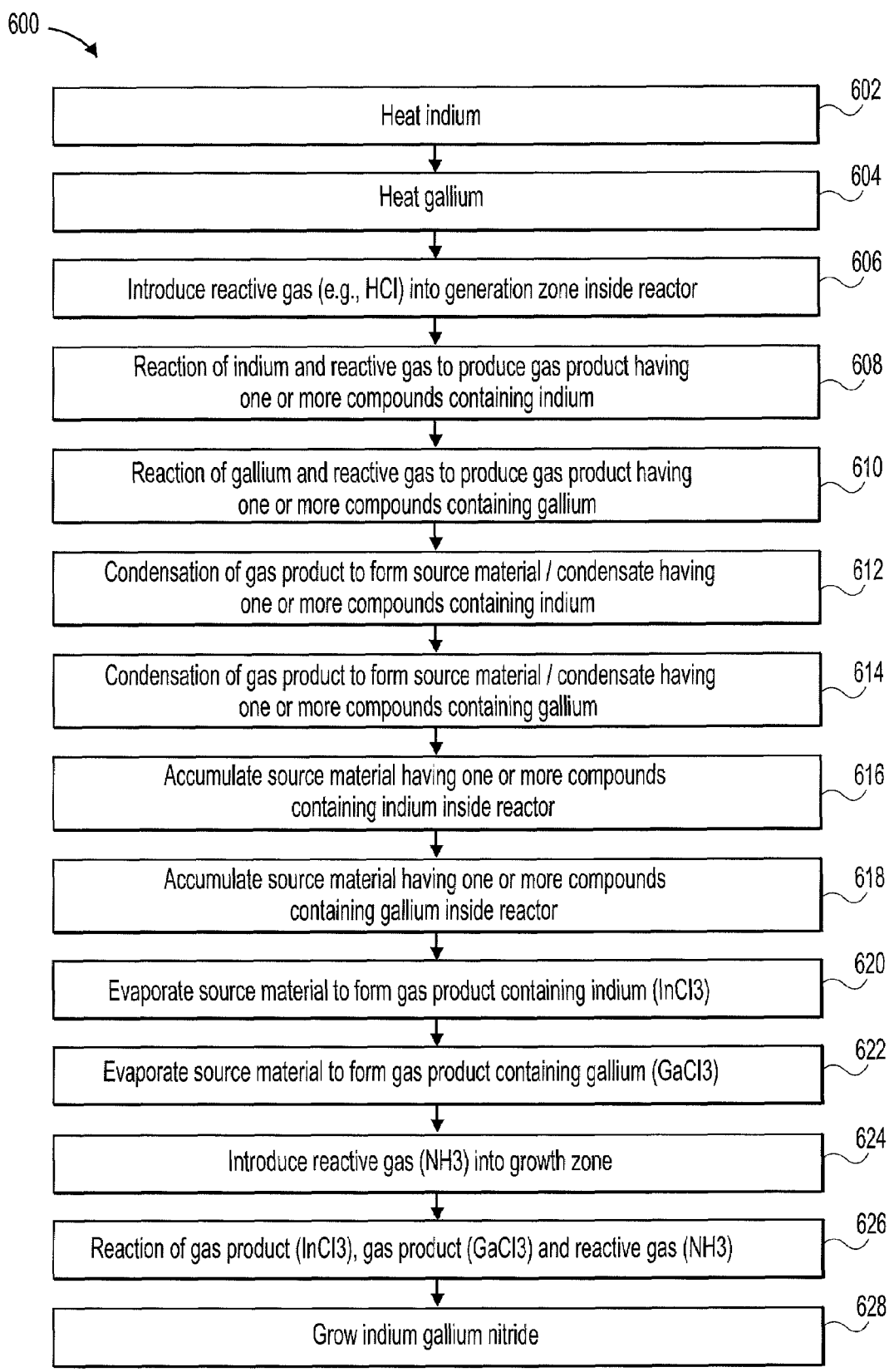
FIG. 6 is a flow chart illustrating a method of generating and accumulating an indium source material inside the reactor and for growing indium gallium nitride inside the reactor shown in FIG. 5 according to one embodiment.

With further reference to FIG. 6 illustrating a method 600 of fabricating high quality materials using the reactor 500 shown in FIG. 5, indium and gallium metal sources 510 and 514 are heated at stages 602 and 604. At stage 606, a first reactive gas 531, e.g., HCl gas, is provided from the source tube 530 and into each section 111 and 112 of the generation zone 110. At stage 608, the first reactive gas 531 passes over and reacts with the indium metal 510 and the gallium metal 514 held in respective boats 512 and 516. The result of the reaction of indium metal 510 and HCl gas 531 is a gas product 550 that includes an indium-containing compound, such as InCl, $InCl_2$ and/or $InCl_3$, in gaseous form. This specification refers to $InCl_3$ for purposes of explanation; however, persons skilled in the art will recognize that the reaction between the first reactive gas 531 and indium 510 may result in other indium-containing compounds.

At stage 610, the result of the reaction of gallium metal 514 and HCl gas 531 is a gas product 552 that includes a gallium-containing compound, such as GaCl, $GaCl_2$ and/or $GaCl_3$, in gaseous form. This specification refers to $GaCl_3$ for purposes of explanation; however, persons skilled in the art will recognize that the reaction between the first reactive gas 531 and gallium 514 may result in other indium-containing compounds.

In alternative embodiments, a reactive gas other than HCl gas can be utilized, such as bromine and other halogens or halogen hydrides. Thus, following the reaction of the first reactive gas 531 and indium 510, the gas product 550 can include various species containing halogen and indium components including InI, InCl, $InCl_2$, $InCl_3$, InBr, $InBr_2$, $InBr_3$, InF, $InF_2$ and/or $InF_3$ depending on the type of reactive gas 531 that is utilized and the result of the reaction of the reactive gas 531 and indium 510. For purposes of explanation, reference is made to HCl gas 531, and a gas product 550 having $InCl_3$ as a result of the reaction of HCl gas 531 and indium 510.

Similarly, following the reaction of the reactive gas 531 and gallium 514, the gas product 552 can include various species containing halogen and gallium components including GaI, GaCl, $GaCl_2$, $GaCl_3$, GaBr, $GaBr_2$, $GaBr_3$, GaF, $GaF_2$ and/or $GaF_3$ depending on the type of reactive gas 531 that is utilized and the result of the reaction of the reactive gas 531 and gallium 514. For purposes of explanation, reference is made to HCl gas 531, and a gas product 552 having $GaCl_3$ as a result of the reaction of HCl gas 531 and gallium 514.

The carrier gas 533, which may be an inert gas such as Argon gas, transports the gas product 550 ($InCl_3$) from the section 111 of the generation zone 110 to the section 121 of the accumulation zone 120. Similarly, the carrier gas 532 transports the gas product 552 ($GaCl_3$) from the section 112 of the generation zone 110 to the section 122 of the accumulation zone 120. The temperatures of the sections 121 and 122 of the accumulation zone 120 are lower than the temperatures in the generation zone 110. As a result, at stage 612, the gas product 550 cools and condenses from a gas into a liquid and/or solid condensate, i.e., a liquid and/or solid indium source material 140 that includes one or more indium-containing compounds. Similarly, at stage 614, the gas product 552 cools and condenses from a gas into a solid condensate 242, i.e., a solid gallium source material that includes one or more gallium containing compounds. According to one embodiment, the collected indium-containing source material 140 is a liquid, and the collected gallium-containing source material 242 is a solid. At stage 616, the liquid indium source material 140 is collected in vessel 520, and at stage 618, solid gallium source material 242 is collected in vessel 522 in respective sections 121 and 122 of the accumulation zone 120.

When indium gallium nitride 540 is to be grown, the temperature of the accumulation zone 120 can be increased so that the collected liquid indium source material 140 evaporates to form a gas product 560 including an indium-containing compound (e.g. $InCl_3$) at stage 620, and the collected solid gallium source material 242 evaporates to form a gas product 562 including a gallium-containing compound (e.g., $GaCl_3$) at stage 622. The gas products 560 and 562 resulting from evaporation are carried by the carrier gas 533 and into the growth zone 130, and another reactive gas (e.g., ammonia 535) is introduced into the growth zone 130 at stage 624. As a result, at stage 626, the gas products 560 and 562 and ammonia 535 react at stage 626, resulting in growth of indium gallium nitride 540 on a substrate 542 at stage 628.

The thickness of the grown indium gallium nitride layer 540 can be controlled from a fraction of nanometers to millimeters, and the composition of the material 540 is controlled by growth temperatures, flow of carrier or inert gas through indium and gallium source channels, and temperatures of the indium and gallium metal sources. The composition of the grown material 540 can vary from 0 mol. % of InN (i.e., pure GaN) to 100 mol. % of InN (i.e., no gallium element) to various InGaN compositions.

FIG. 6 illustrates a method 600 for generating and accumulating indium and gallium source materials for growing indium gallium nitride. The reactor shown in FIG. 5 can be configured for growth of different ternary and quaternary materials using one or multiple internally generated and collected source materials. For example, a method may involve growing indium aluminum nitride in the reactor shown in FIG. 5 rather than indium gallium nitride. In this embodiment, step 604 involves heating aluminum rather than heating gallium, step 610 involves a reaction of aluminum and a reactive gas (HCl) to produce a gas product having one or more compounds containing aluminum, step 614 involves condensation of a gas product to form a source material/condensate having one or more compounds containing aluminum, step 618 involves accumulating a source material having one or more compounds containing aluminum inside reactor, step 622 involves evaporating source material to form gas product containing aluminum ($AlCl_3$); step 626 involves a reaction of a gas product ($InCl_3$), another gas product ($AlCl_3$) and reactive gas ($NH_3$), and step 628 involves growth of indium aluminum nitride.

Similarly, a method may involve growing indium gallium aluminum nitride in the reactor shown in FIG. 5 rather than indium gallium nitride. In this embodiment, all of the stages of FIG. 6 are performed and stages corresponding to aluminum are added. Thus, for example, in addition to stages 602 and 604, aluminum would be heated. In addition to stages 608 and 610, a reaction of aluminum and a reactive gas (HCl) would occur to produce a gas product having one or more compounds containing aluminum. In addition to stages 612 and 614, a gas product would condense to form a source material/condensate having one or more compounds containing aluminum. In addition to stages 616 and 618, a source material having one or more compounds containing aluminum inside reactor is accumulated. In addition to stages 620 and 622, a source material is evaporated to form gas product containing aluminum ($AlCl_3$). Stage 624 is also performed; the resulting reaction and growth involve a reaction of a gas product ($InCl_3$), another gas product ($GaCl_3$), a further gas product ($AlCl_3$) and a reactive gas ($NH_3$) to grow indium gallium aluminum nitride.

Thus, persons skilled in the art will appreciate that embodiments shown in FIGS. 1-6 can be applied to grow various ternary and quaternary materials. Further, conditions for generating and collecting source materials may vary depending on required material compositions and epitaxial structure parameters. Further, persons skilled in the art will appreciate that the various ternary and quaternary materials that are grown can be doped with various dopants, such as SiH4 for n-type doping, and magnesium and zinc for p-type doping.

Figure 7:
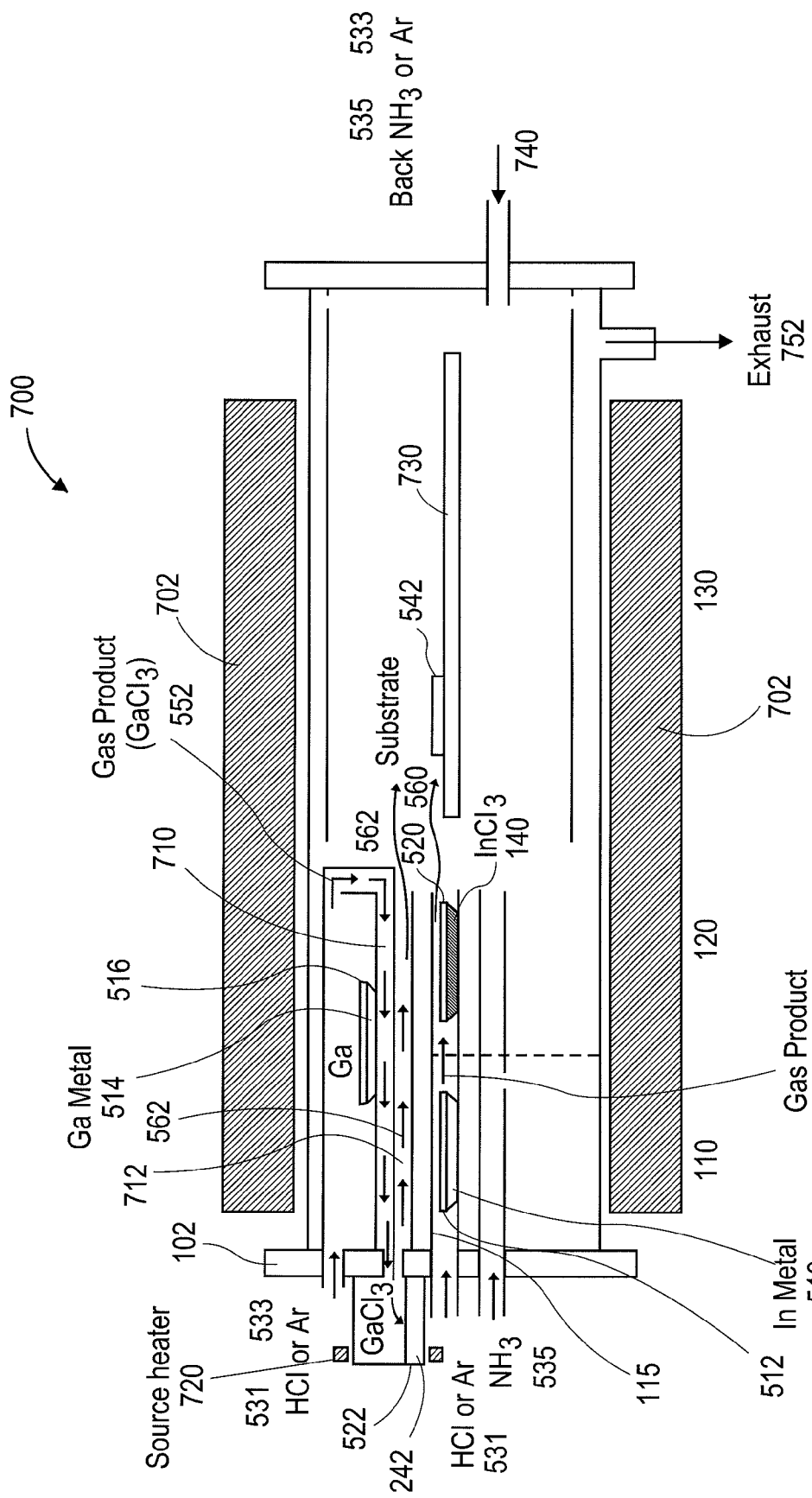
FIG. 7 illustrates an alternative embodiment of a HVPE reactor for generating and accumulating an indium and gallium source materials and for growing indium gallium nitride inside the reactor.

FIG. 7 illustrates a HVPE reactor 700 according to one embodiment in which wall or divider 115 separates sections of the growth and accumulation zones 110 and 120 and furnace or heating elements 702 surround the reactor 700 to provide control over the temperature of each zone. In the illustrated embodiment, the vessel 522 for holding the solid gallium source material 242 is positioned on one side of a flange 102 of the reactor, while the gallium metal source 514 and the indium source material 140 are positioned on the other side of the wall 102. This configuration facilitates cooling of the gallium metal 514 and resulting gallium source material 242 relative to other sections of the reactor 700 that are at higher temperatures.

As shown in FIG. 7, as during generation/accumulation, a reactive gas (e.g. HCl 531) is passed over the gallium metal 514, which reacts to form a gas product 552 that passes through a conduit 710 and to a collection reservoir or vessel 522. A temperature element 720 disposed around the collection reservoir or vessel 522 maintains the vessel 522 at a temperature so that the incoming gas 552 cools, thereby resulting in condensation of the gas 552 into solid gallium source material 242. When sufficient source material 242 has been accumulated, the temperatures in the generation zone 110 and/or accumulation zone 120, including in the collection reservoir or vessel 522, can be adjusted so that the heated gallium source material 514 evaporates, resulting in a gas product 562 (containing $GaCl_3$), which travels through a conduit 712 and to the growth zone 130. The gas product 562 reacts with the gas product 560 (containing $InCl_3$) and incoming ammonia gas for growth of indium gallium nitride on the substrate 542 held by the substrate holder 730. A backflow source 740 provides gas to adjust the pressure inside the growth zone 130. After growth, waste materials can be exhausted via line 752.

FIG. 7 illustrates an alternative embodiment in which the vessel 522 for the gallium source material 242 is positioned on a side of the flange 102 of the reactor 700. Alternatively, the vessel 522 can be placed outside of the reactor 700. However, in both cases, the gallium source material 242 is defined as being contained inside the reactor 700 since the gallium source material is contained within the collection vessel 522 and insulated from the external environment.

In alternative embodiments, the reactor 700 may be configured so that the collection vessel 522 is positioned on the other side of the flange 102 inside the reactor 700 using, e.g., cooling elements to maintain desired lower temperatures of the gallium source material 242. Accordingly, FIGS. 5 and 7 are provided to generally illustrate that the gallium source material 242, regardless of the location of the collection vessel 522, is inside the reactor 700 since it is insulated from the external environment, and that reactors can be configured in different ways to preserve the insulated environment.

Further, while FIGS. 5 and 7 illustrate growth on a single substrate, embodiments can involve other sets of sources or channels and substrates for simultaneous growth on multiple substrates, e.g., two, ten twenty or other numbers of substrates 380. Persons skilled in the art will appreciate that the arrangement of source tubes can vary, and that FIGS. 4 and 5 are provided for purposes of illustration.

Figure 8:
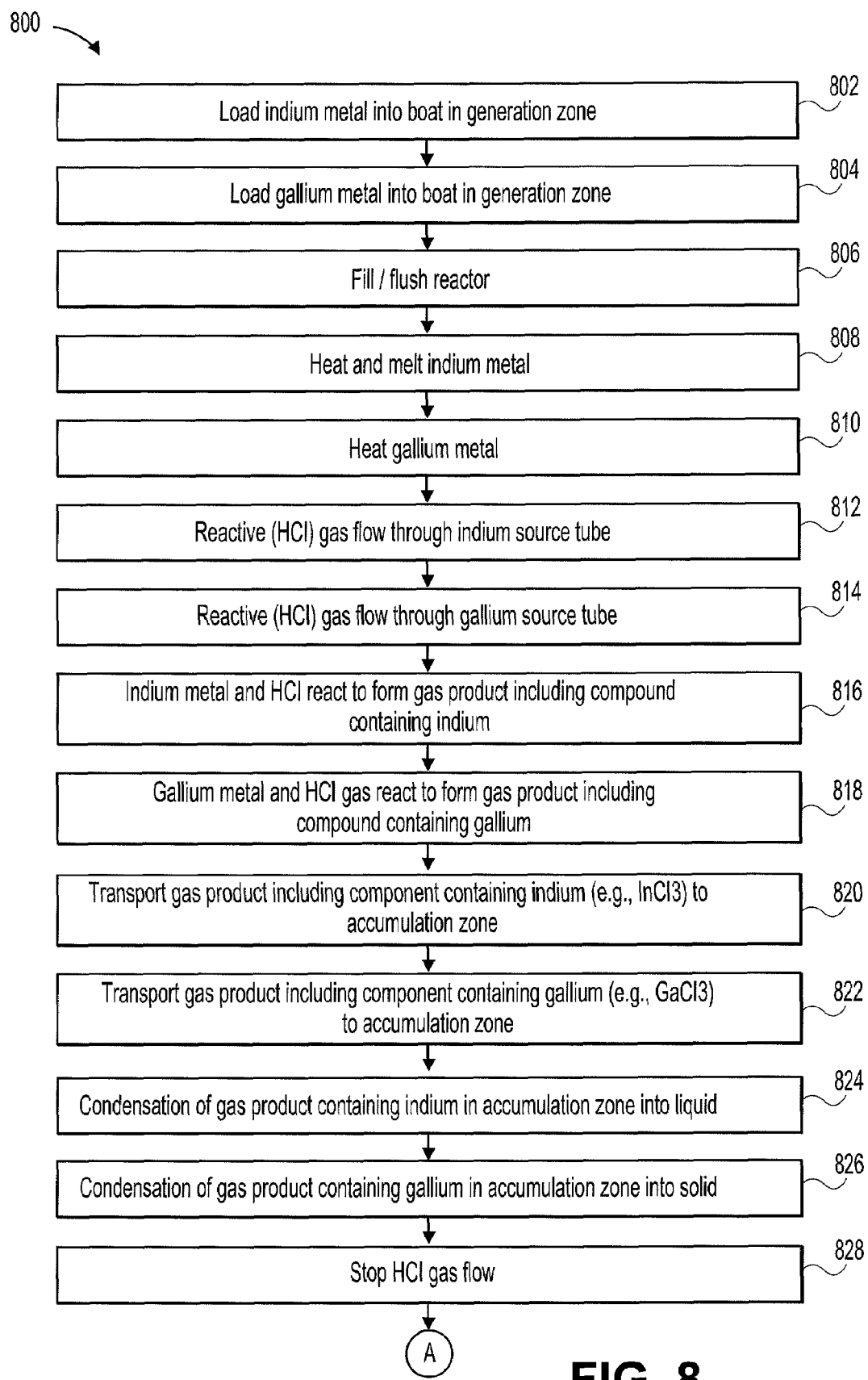
FIG. 8 is a flow chart illustrating another method of generating and accumulating an indium source material inside a HVPE reactor and growing indium gallium nitride according to another embodiment.
Figure 8:
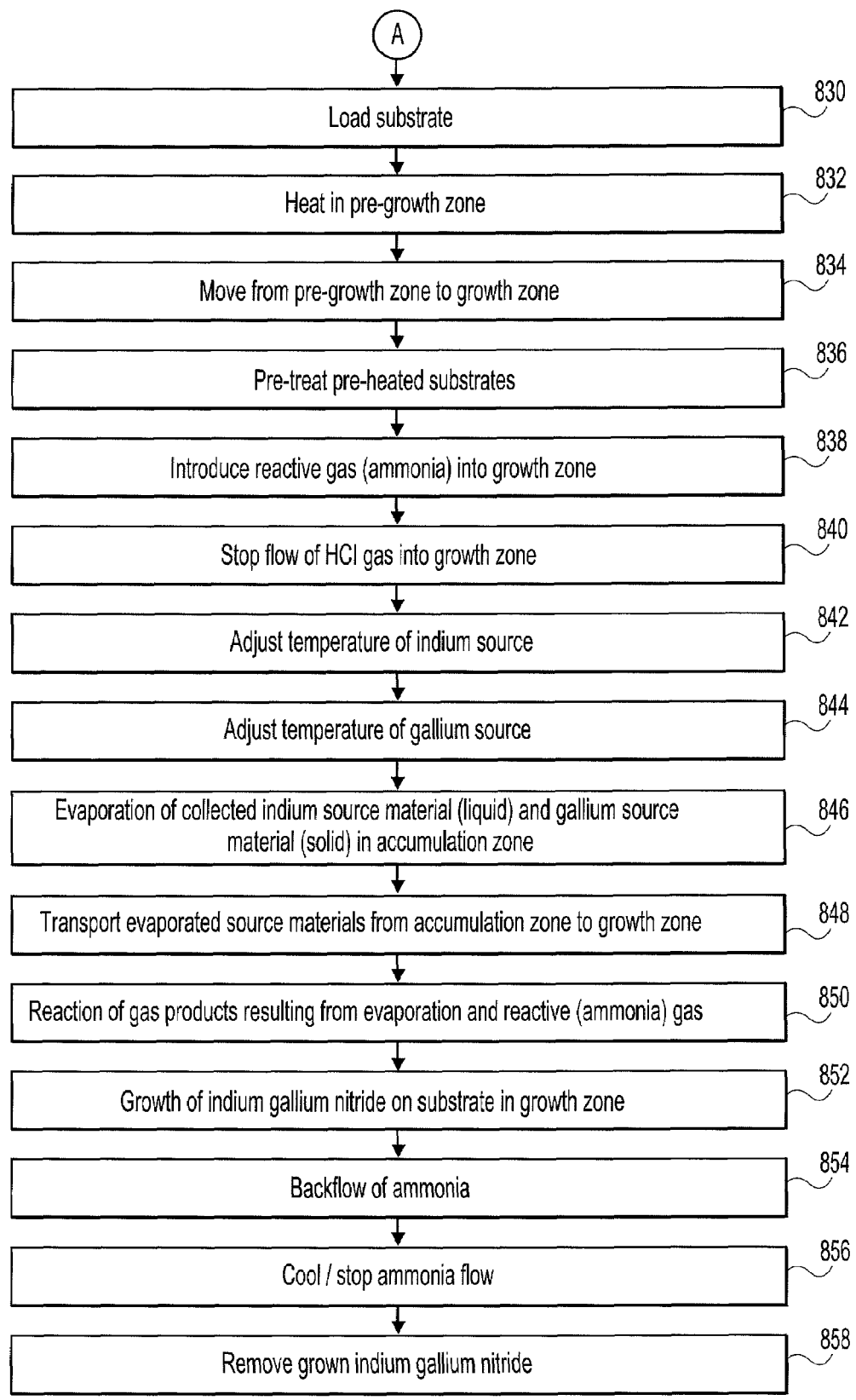

FIG. 8 illustrates in further detail a method 800 of growing ternary and quaternary materials including indium, e.g. indium gallium nitride using, for example, the reactor configurations shown in FIGS. 5 and 7, and other reactors having generation, accumulation and growth zones 110-130. Although FIG. 8 describes growth of indium gallium nitride, embodiments can be used to grow other ternary and quaternary nitride materials including indium aluminum nitride and indium gallium aluminum nitride.

At stage 802, indium metal is loaded into a boat in the generation zone, and at stage 804, gallium metal is loaded into a boat in the generation zone. At stage 806, the reactor and source tubes and collection vessels are filled and flushed with inert gas such as argon. The generation zone is heated to heat and melt indium metal at stage 808 and to heat gallium metal at stage 810. At stage 812, HCl gas or another suitable reactive gas flows through an indium source tube, and at stage 814 the same or other suitable reactive gas flows through a gallium source tube. At stage 816, indium and HCl gas react to form a gas product that includes a compound containing indium, and at stage 818, gallium and HCl gas react to form a gas product including a compound containing gallium.

At stage 820, the gas product including a component containing indium (e.g., $InCl_3$) is transported from the generation zone to the accumulation zone using a carrier gas such as argon. At stage 822, the gas product including a component containing gallium (e.g., $GaCl_3$) is transported from the generation zone to the accumulation zone using the carrier gas. At stage 824, the gas product including a compound containing indium condenses from a gas to a liquid and is collected in the corresponding accumulation zone. At stage 826, the gas product including a compound containing gallium condenses from a gas to a solid and is collected in the accumulation zone. Each group III metal in the generation zone is placed at a temperature above a boiling (sublimation) point of the corresponding halide (in this example, HCl gas), thereby causing formation of gaseous species of $InCl_3$ and $GaCl_3$, which are transported to the accumulation zone and placed at a temperature below the condensation point of these halides, thereby resulting in collection of liquid indium source material and solid gallium source material.

Figure 9:
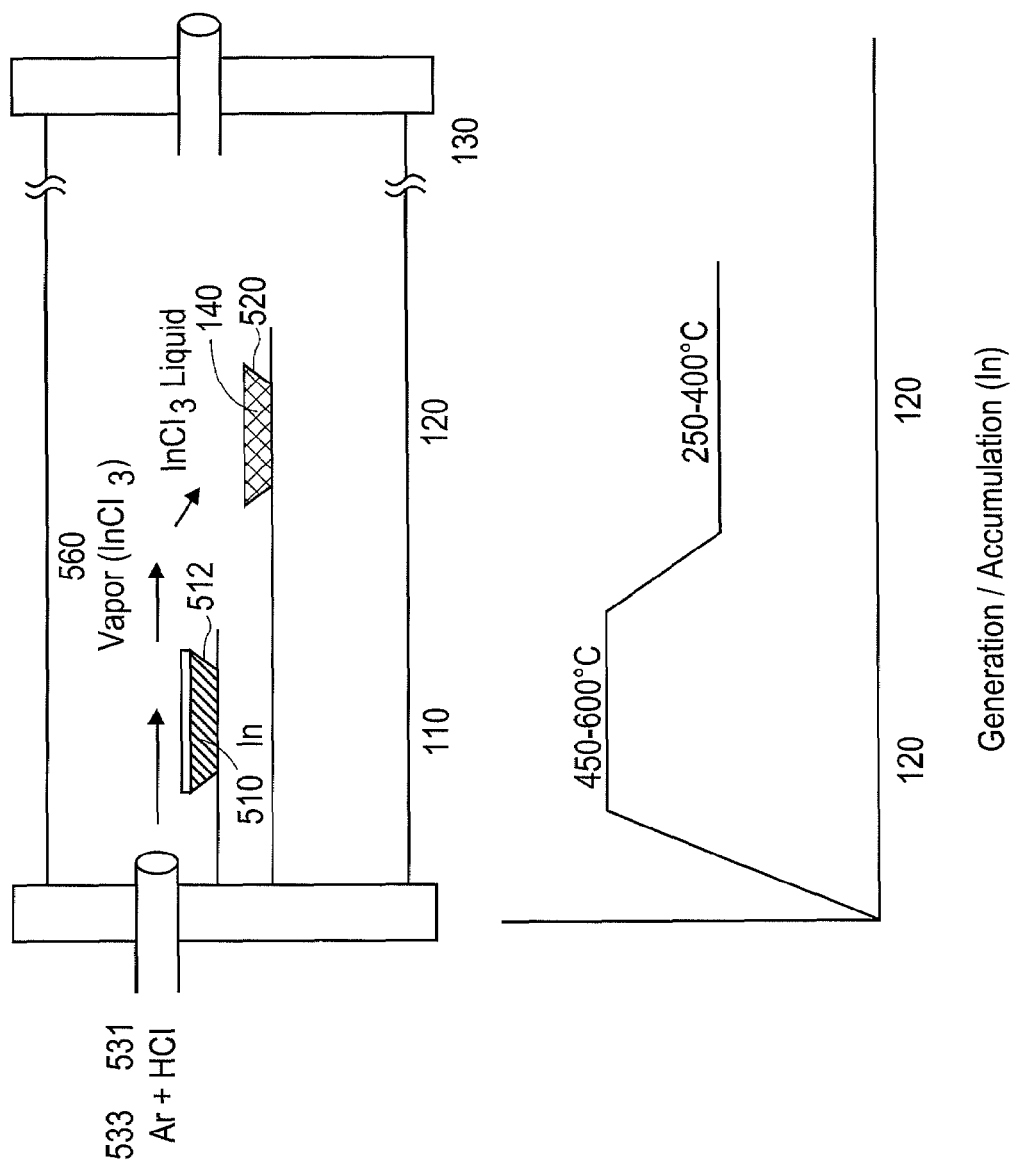
FIG. 9 illustrates temperatures of indium metal and collected liquid indium source material in accumulation and generation zones during generation/accumulation.

FIGS. 9-14 illustrate temperatures in the generation and accumulation zones 110 and 120 for generation and accumulation of different source materials. FIG. 15 further illustrates temperatures in different portions of a reactor during growth. Referring to FIG. 9, during generation/accumulation of an indium source material 140, the temperature of the metallic indium 510 in the indium boat 512 is maintained in a range from about 450-600° C. Such temperatures provide rapid generation of the gas product 550 that is transported to the corresponding section in the accumulation zone 120, which is at a lower temperature of about 250-400° C. These lower temperatures ensure effective condensation of the gas product 550 and formation of liquid indium source material 140, which is collected in the vessel 520. The duration of the accumulation process can be, e.g., about 20 minutes to 3 or more hours depending on amount of indium source material 140 to be generated and collected. One suitable accumulation vessel 520 is composed of quartz or sapphire and has a volume of approximately 1-100 cm$^3$.

Figure 10:
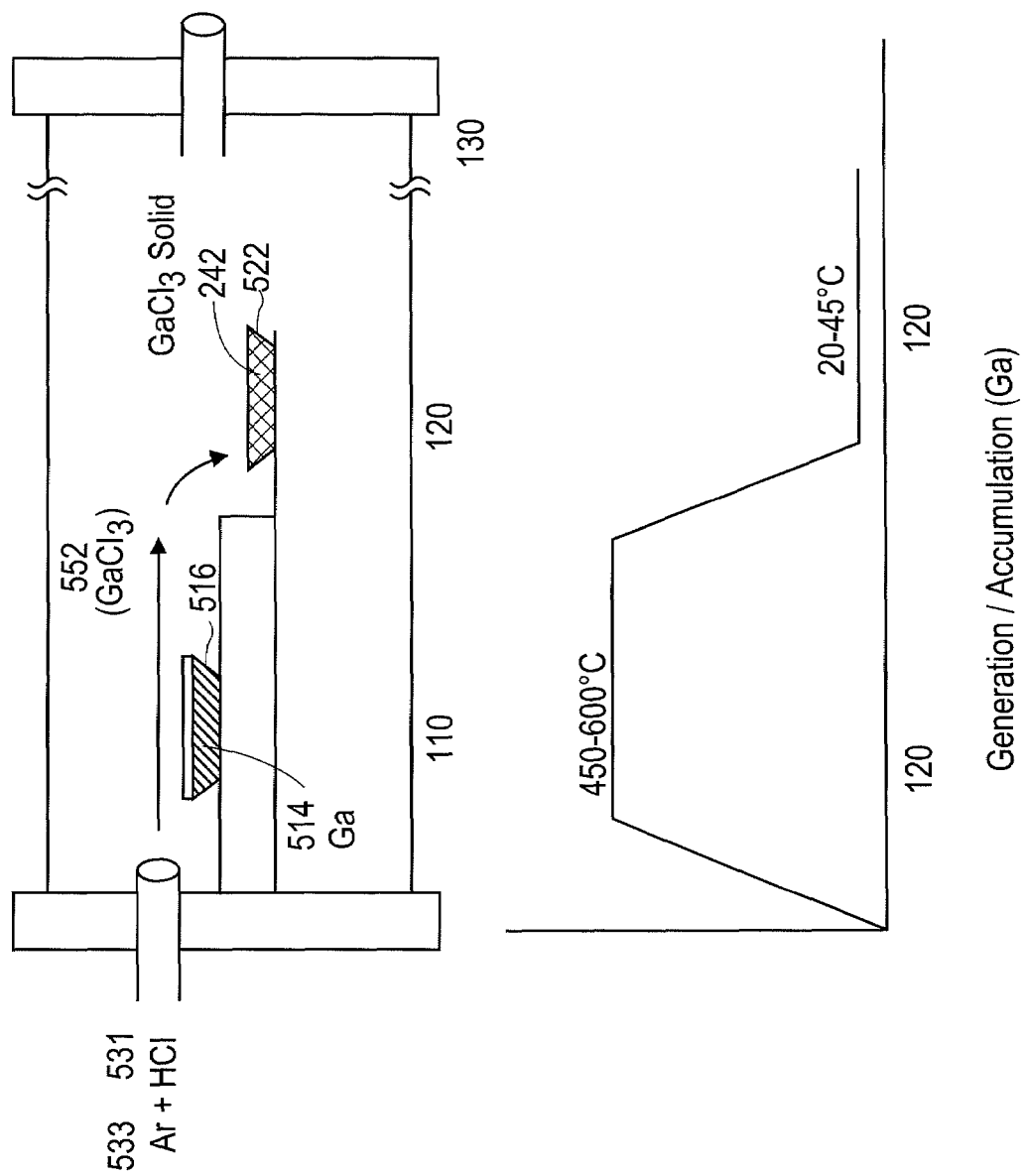
FIG. 10 illustrates temperatures of gallium metal and collected solid gallium source material in accumulation and generation zones during generation/accumulation.

Referring to FIG. 10, during the generation/accumulation, the temperature of the metallic gallium 514 in the gallium boat 516 is maintained at a temperature of about 450-600° C. Such temperatures provide rapid generation of the gas product 552 that is transported to the corresponding section in the accumulation zone 120, which is at a lower temperature of about 20-45° C. These lower temperatures ensure effective condensation of the gas product 552 and formation of solid gallium source material 242, which is collected in the vessel 522. The duration of accumulation of solid gallium source material 242 can vary, e.g., from about 20 minutes to three or more hours, depending on amount of gallium source material 242 to be generated and collected. One suitable accumulation vessel 522 is composed of Pyrex, quartz or sapphire and can have a volume of about 10 to 200 cm$^3$ or larger (e.g., for growth of thick layers).

Figure 11:
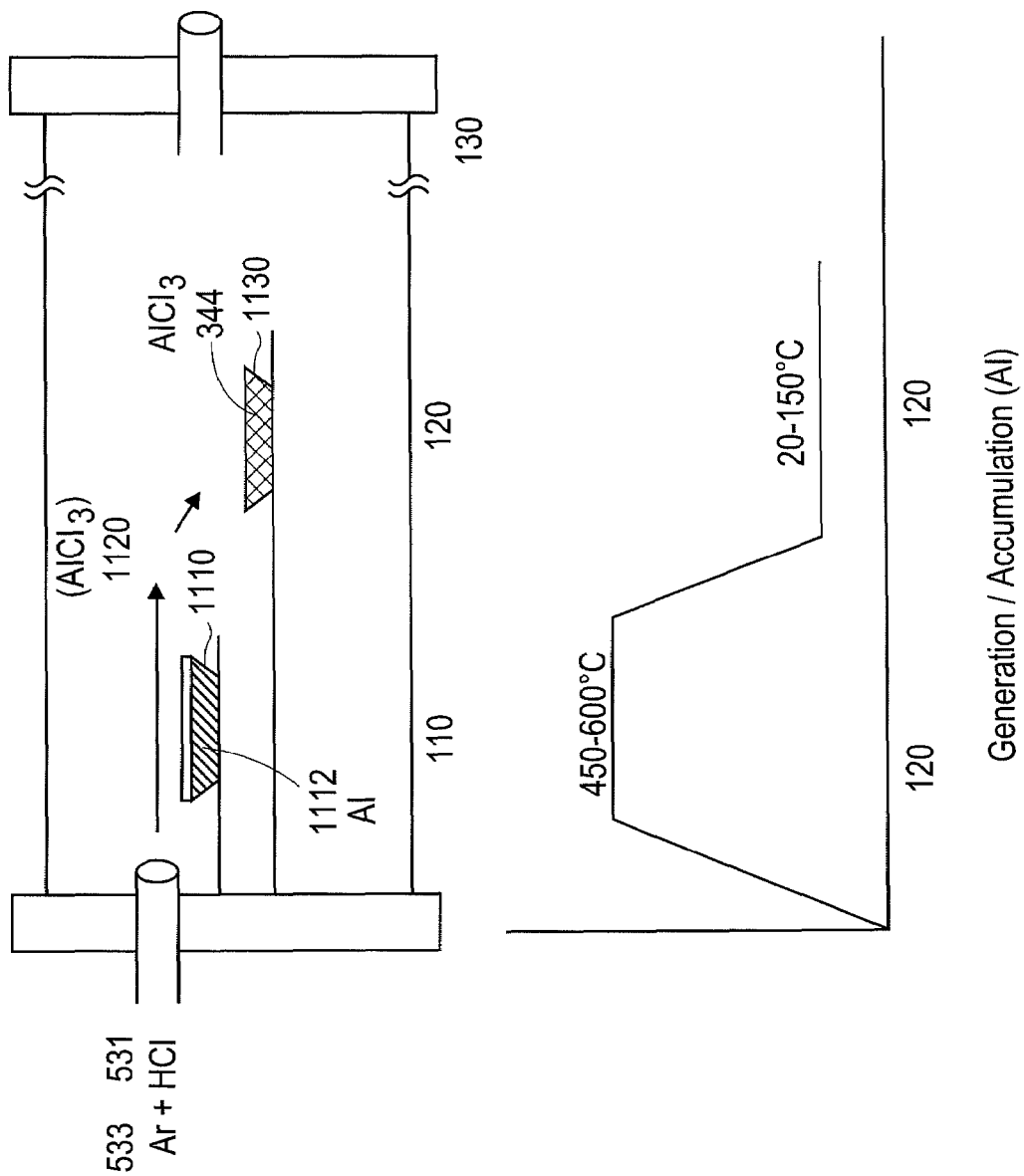
FIG. 11 illustrates temperatures of aluminum metal and collected aluminum source material in accumulation and generation zones during generation/accumulation.

Referring to FIG. 11, if aluminum is utilized, during the generation/accumulation of an aluminum source material 344 (e.g., AlCl$_3$), the temperature of the metallic aluminum 1112 in the aluminum boat 1110 in the corresponding section of the generation zone 110 can be about 450-550° C. Such temperatures provide rapid generation of a gas product 1120 including a compound containing aluminum. The gas product 1120 resulting from the generation stage is transported to the corresponding section of the accumulation zone 120, which is at a lower temperature of about 20-150° C. This lower temperature ensures effective condensation of the gas product 1120 and formation of an aluminum source material 344, which is collected in a vessel 1130.

Referring again to FIG. 8, at stage 828, after sufficient source materials in liquid and solid form have been accumulated, flow of HCl gas through the indium and gallium source tubes is stopped. The carrier gas can continue to flow. At stage 830, one or more substrates are loaded into the reactor. If a pre-growth zone is utilized, the substrates can be loaded into the pre-growth zone and heated at stage 832. At stage 834, the pre-heated substrates can be moved from the pre-growth zone to the growth zone. At stage 836, the pre-heated substrates can be pre-treated by introducing a reactive gas, such as HCl gas, into the indium source tube to pre-treat the substrates by exposing the substrates to a mixture of HCl gas and InCl3 source material. The duration of the pre-treatment can be about 10 to 30 minutes.

After pre-heating and pre-treatment, at stage 838, ammonia is introduced into the growth zone, and at stage 840, the flow of HCl gas into the growth zone is stopped. Thus, at this stage, no HCl gas flows in the growth zone. At stage 842, in preparation for growth, the temperature of the indium source is adjusted, and at stage 844, the temperature of the gallium source is adjusted. For example, the temperature of the indium boat is reduced to prevent free indium evaporation during the growth stage and droplets incorporation into grown indium gallium nitride crystals. At stage 846, collected liquid indium source material is heated and evaporated, and collected solid gallium source material is heated and evaporated.

Figure 12:
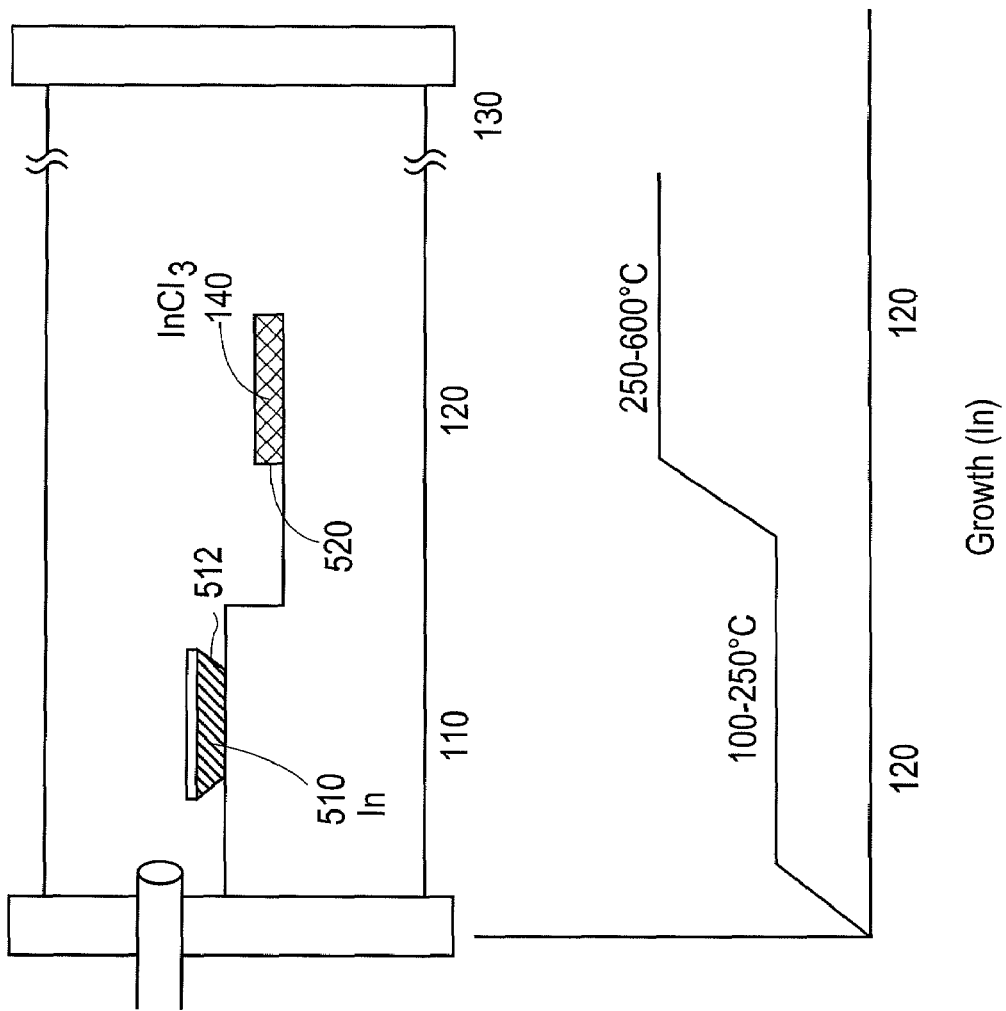
FIG. 12 illustrates temperatures of indium metal and collected liquid indium source material in accumulation and generation zones during growth of a material on a substrate.

For example, referring to FIG. 12, during growth, the temperature of the indium metal 510 in the indium boat 512 is maintained at a temperature between about 100-250° C. Such temperatures prevent free indium metal evaporation and metallic droplet inclusions formation in a grown layer 540. The temperature of the liquid indium source material 140 held in the vessel 520 in the accumulation zone 120 is about 250-600° C. so that the source material 140 evaporates and is transported to the growth zone 130.

Figure 13:
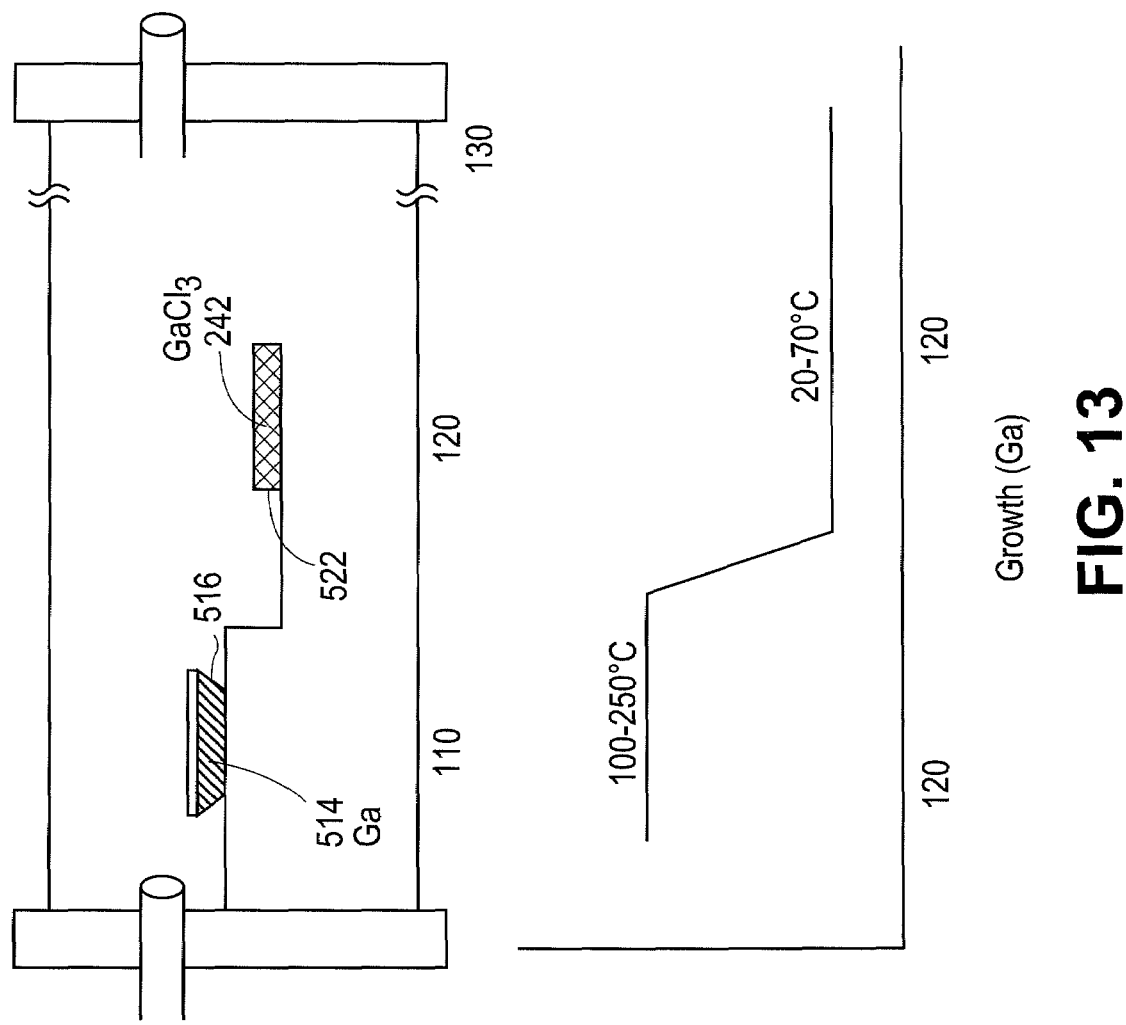
FIG. 13 illustrates temperatures of gallium metal and collected solid gallium source material in accumulation and generation zones during growth of a material on a substrate.

Referring to FIG. 13, during growth, the temperature of the gallium metal 514 in the gallium boat 516 is maintained at a temperature between about 100-250° C. Such temperatures prevent free gallium metal evaporation and metallic droplet inclusions formation a grown layer 540. The temperature of the solid gallium source material 242 held in the vessel 522 in the accumulation zone 120 is about 20-70° C. in order to provide the required mass flow of gallium containing compounds for effective InGaN 540 growth.

Figure 14:
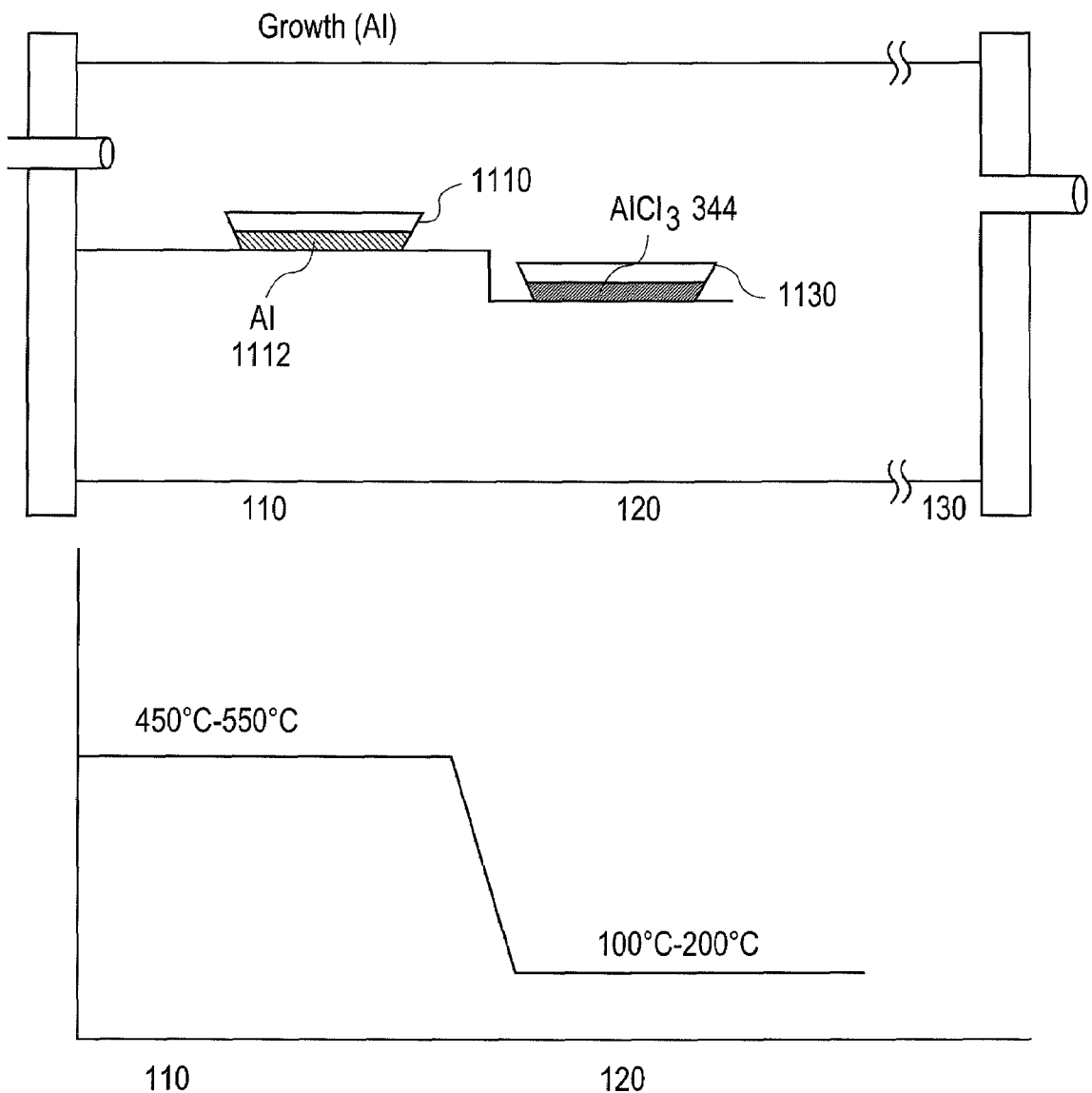
FIG. 14 illustrates temperatures of aluminum metal and collected aluminum source material in accumulation and generation zones during growth of a material on a substrate.
Figure 15:
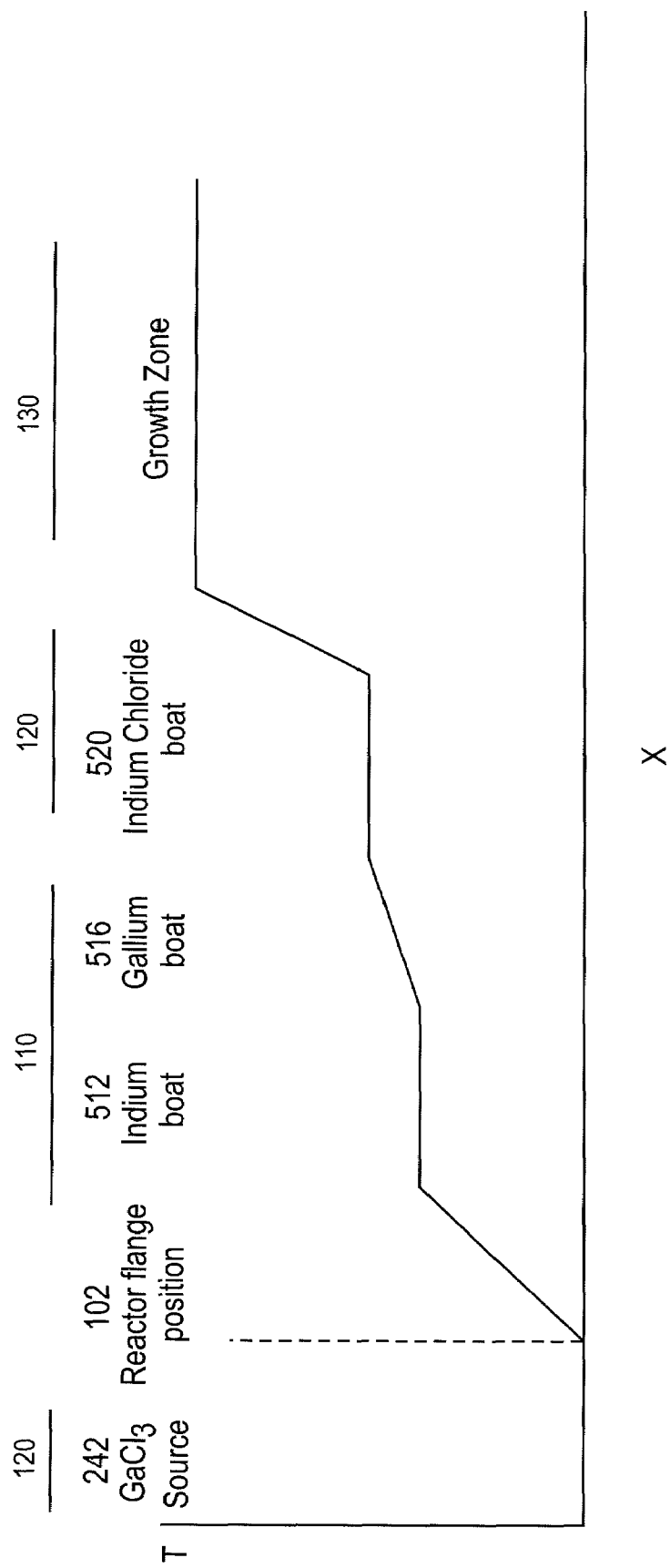
FIG. 15 further illustrates temperatures in various zones of a reactor.
Figure 16:
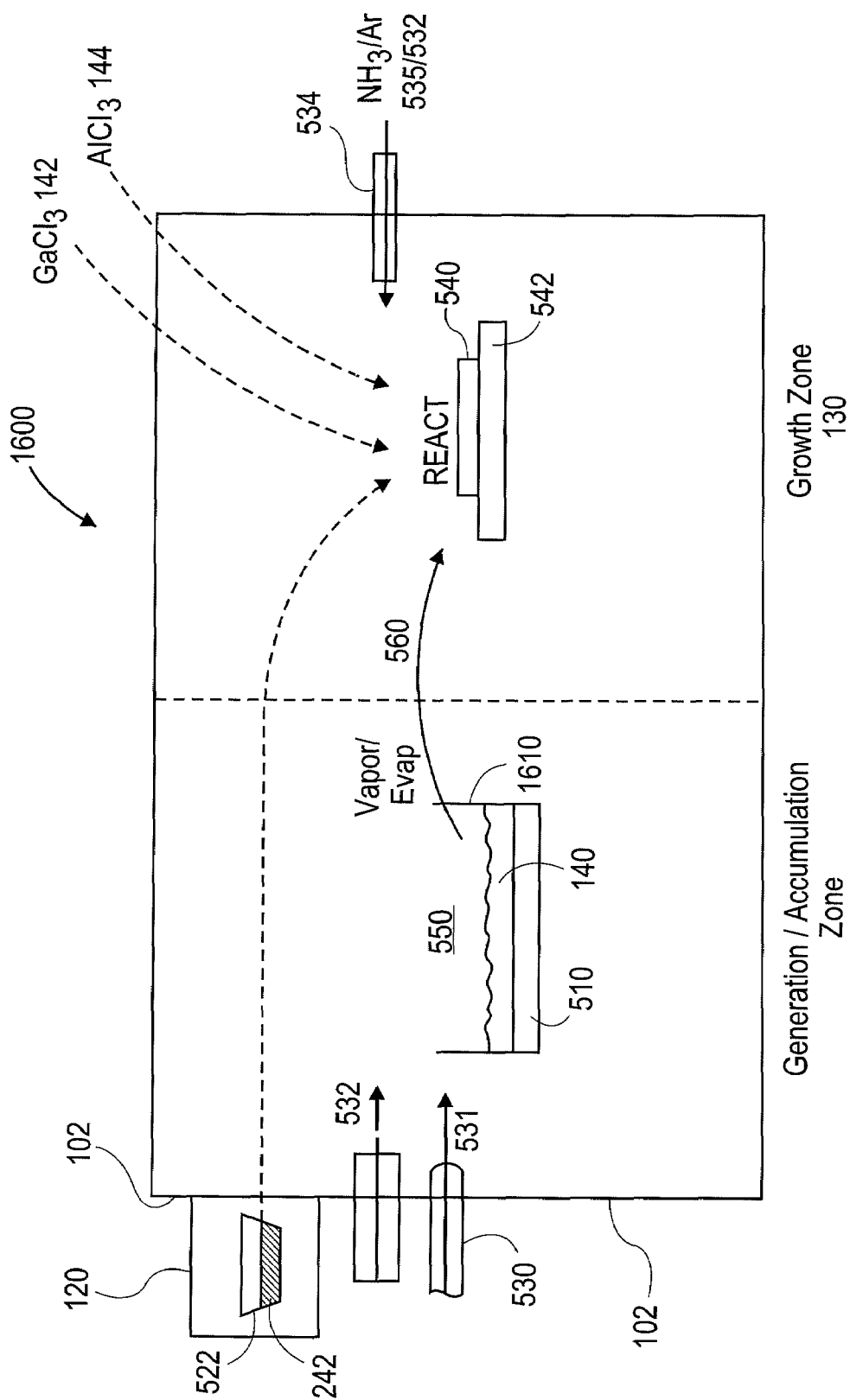
FIG. 16 is a system flow diagram illustrating a HVPE apparatus having a combination generation/accumulation zone according to another embodiment.

Referring to FIG. 14, if aluminum is utilized, during growth, the temperature of the aluminum metal 1112 in the aluminum boat 1110 in the generation zone 110 can be about 450-500° C., and the temperature of the aluminum source material 344 held in the vessel 1130 can be maintained at a temperature of about 100-200° C. to provide required mass flow of aluminum containing compounds for effective growth of indium aluminum nitride or indium gallium aluminum nitride growth.

FIG. 15 illustrates the temperature distribution across the reactor during the growth stage with reference to the configuration shown in FIG. 7 in which a reservoir or vessel 522 for holding the solid gallium source material 242 is located on a flange 102 or outside of the reactor 700, but defined as being inside the reactor since the source material 242 is insulated from the external environment. With this configuration, during growth, the temperature of the collected gallium source material 242 (including GaCl3) in the section of the accumulation zone 120 on in the vessel 522 attached to the flange 102 is about 20-70° C. The temperature of the indium metal 510 in the indium boat 512 in the generation zone 110 is about 100-250° C., and the temperature of the gallium metal 514 in the gallium boat 516 in the generation zone 110 is also about 100-250° C. FIG. 15 shows the temperature of the gallium metal 514 being slightly higher than the temperature of the indium metal 510). The temperature of the indium source material 140 (including InCl$_3$) collected in the vessel 520 is about 250-600° C., and the temperature in the growth zone is about 500-850° C.

Referring again to FIG. 8, at stage 848, the gas products resulting from evaporation of the collected source materials are transported from the accumulation zone to the growth zone where they react with ammonia at stage 850, resulting in growth of indium gallium nitride on the substrate at stage 852. During growth, the flow of argon through the indium source channel can be about 0.1-10 liters per minute, the flow of argon through the gallium source channel can be about 0.1-10 liters per minute, and the flow of argon through the ammonia channel can be about 1-20 liters per minute. At stage 854, a backflow of ammonia is provided to prevent thermal decomposition of the grown layer, and at stage 856, the substrate holder is allowed to cool and flow of ammonia gas is stopped. The grown indium gallium nitride crystals are then extracted at stage 858.

The process of generating and accumulating high purity source materials and inside of a HVPE reactor is controlled, e.g., by gas flow parameters, temperature and temperature distribution parameters, and other technological parameters, such as the amount of metallic loads in the generation zone and surfaces areas of the metal source that are exposed to a halogen-containing source gas. Further, sections of an accumulation zone for different source materials may differ in terms of temperature, position, and other parameters. For example, in one embodiment, gallium source material 242 can be collected in a vessel 522 that is connected to a reactor flange 102 or placed outside the main reactor tube (while still being insulated from the external environment) to accommodate different temperatures associated with different materials and process stages.

Persons skilled in the art will appreciate that the examples of temperatures and other process parameters provided above can vary and be adjusted as necessary. For example, temperatures, boat shapes, gas flows and other parameters may be adjusted for specific required growth rates, substrate holder geometries and other parameters.

Embodiments described above and shown in FIGS. 1-15 illustrate separate generation and accumulation zones. In an alternative embodiment, referring to FIG. 16, a HVPE reactor 1600 or a section of a reactor can be configured so that a single vessel or container 1610 holds a metallic load, such as indium metal 510 and, in addition, a source material, such as a liquid source material 140, resulting from condensation of a gas product derived from the indium metal 510.

Thus, in the illustrated embodiment, the apparatus 1600 includes two zones—a combination generation/accumulation zone 1620 and a growth zone 130. Otherwise, the embodiment shown in FIG. 16 operates in a similar manner as the embodiments described above. The system configuration shown in FIG. 16 may replace certain sections of a reactor and eliminate the need to carry a gas product from a generation zone 110 to an accumulation zone 120 and the need for an additional collection vessel.

Epitaxial Growth Using Internally Generated and Collected Source Material

HVPE reactor and method embodiments can be used for epitaxial growth of various ternary and quaternary materials on a substrate using source materials that are generated and accumulated inside the reactor. Substrates for epitaxial growth can be positioned vertically, horizontally, or at some angle in respect to gas flows. An epitaxial layer can have a thickness of about fraction of nanometers to about several millimeters. Epitaxial growth can be performed during a single growth process. Alternatively, epitaxial growth can be interrupted and resumed. Gases can also be added to the growth zone to control and adjust compositions, doping and other properties.

Figure 17:
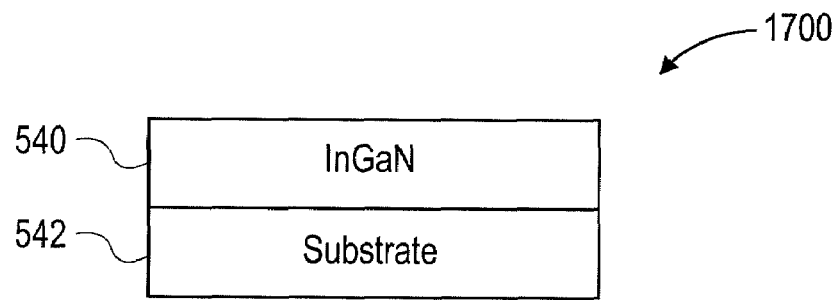
FIG. 17 illustrates an epitaxial structure including an indium gallium nitride layer grown on a substrate.
Figure 18:
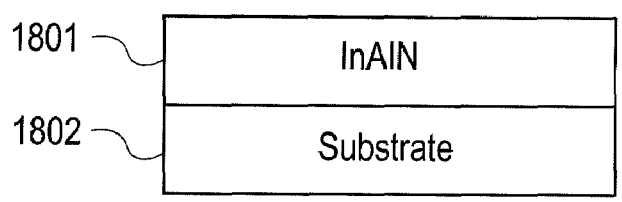
FIG. 18 illustrates an epitaxial structure including an indium aluminum nitride layer grown on a substrate.
Figure 19:
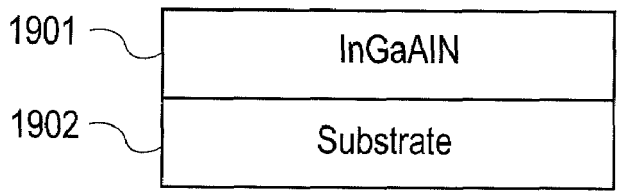
FIG. 19 illustrates an epitaxial structure including an indium gallium aluminum nitride layer according to one embodiment.
Figure 20:
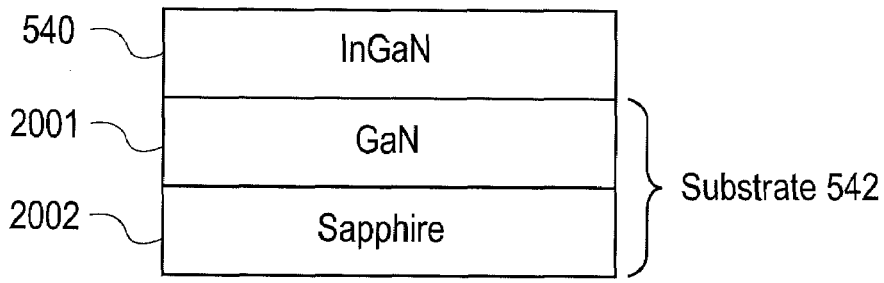
FIG. 20 illustrates an indium gallium nitride layer grown on a GaN-sapphire template.

Referring to FIG. 17, an epitaxial structure 1700 according to one embodiment that can be grown using HVPE reactor and method embodiments includes a low defect density indium gallium nitride single crystal layer 540 on a substrate 542. Referring to FIG. 18, an epitaxial structure 1800 according to another embodiment that can be grown using HVPE reactor and method embodiments includes a low defect density indium aluminum nitride single crystal layer 1801 on a substrate 1802. Referring to FIG. 19, an epitaxial structure 1900 according to another embodiment that can be grown using HVPE reactor and method embodiments includes a low defect density indium aluminum nitride single crystal layer 1901 on a substrate 1902. Referring to FIG. 20, the substrate 542 can be a GaN 2001 on sapphire 2002 template substrate.

Figure 21:
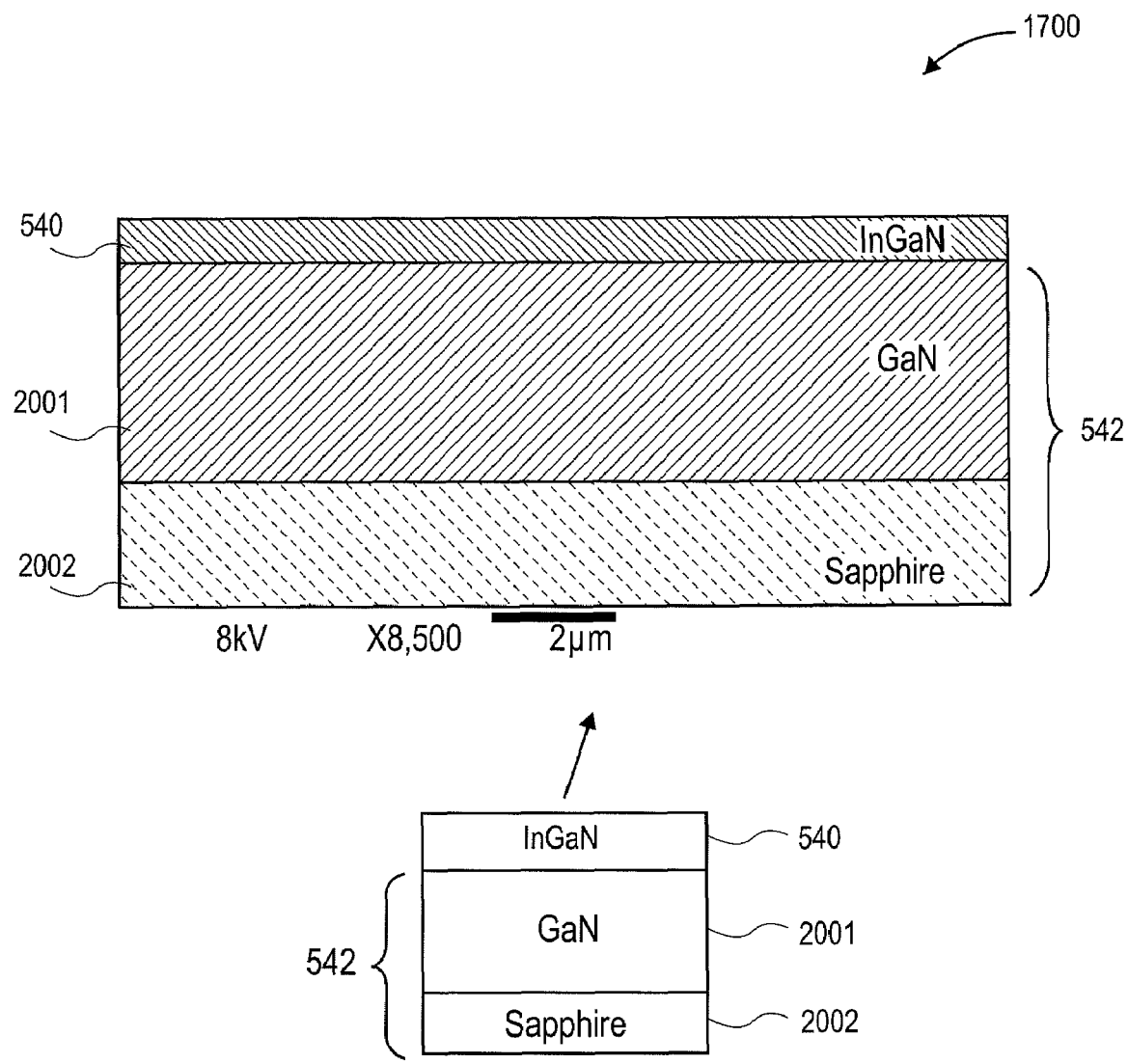
FIG. 21 is a scanning electron micrograph image of indium gallium nitride grown on a GaN-sapphire template.

FIG. 21 is a scanning electron micrograph (SEM) image of cross-section of an InGaN layer 540 that was grown on a GaN/sapphire template substrate (as generally illustrated in FIG. 20) using HVPE reactor and method embodiments. The grown layer 540 was deposited over the entire substrate 542. As shown in FIG. 21, the thickness of the InGaN layer was about 0.5 microns. The thickness uniformity (thickness standard deviation for a two inch wafer) for was better than 10%. The corresponding average HVPE growth rate for InGaN was about 0.5 microns per hour.

Figure 22:
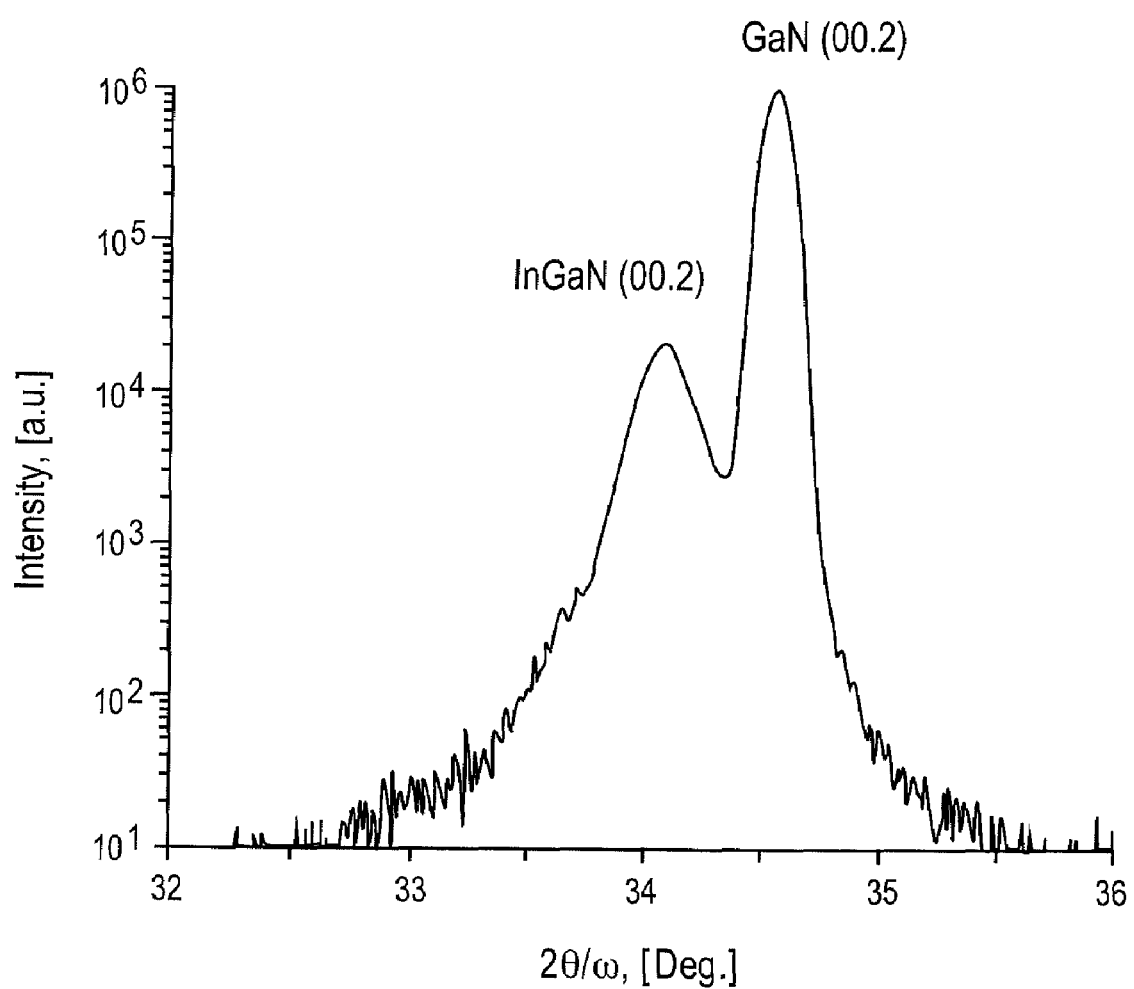
FIG. 22 is graph showing an x-ray diffraction spectrum for an InGaN layer measured using 2Θ/ω scanning geometry.

The improved quality of grown indium gallium nitride layers 540 is demonstrated by x-ray, optical and other characterization data. Referring to FIG. 22, structural characterization of the grown InGaN layer 540 was performed using x-ray diffraction methods. More particularly, x-ray measurements were conducted using $2\Theta/\omega$ scanning geometry. These measurements showed the existence of a single crystalline InGaN layer 540 grown on GaN-on-sapphire and AlN-on-sapphire substrates 542. The x-ray diffraction peaks from the $In_xGa_{1-x}N$ layer 540 and from the template substrate 542 materials are presented in the scan shown in FIG. 22. The positions of the $In_xGa_{1-x}N$ (00.2) reflection in different experiments varied from 31.3° to 34.54°, corresponding to x=0.99 to x=0.01 respectively. No traces of indium metal were detected in the materials.

Figure 23:
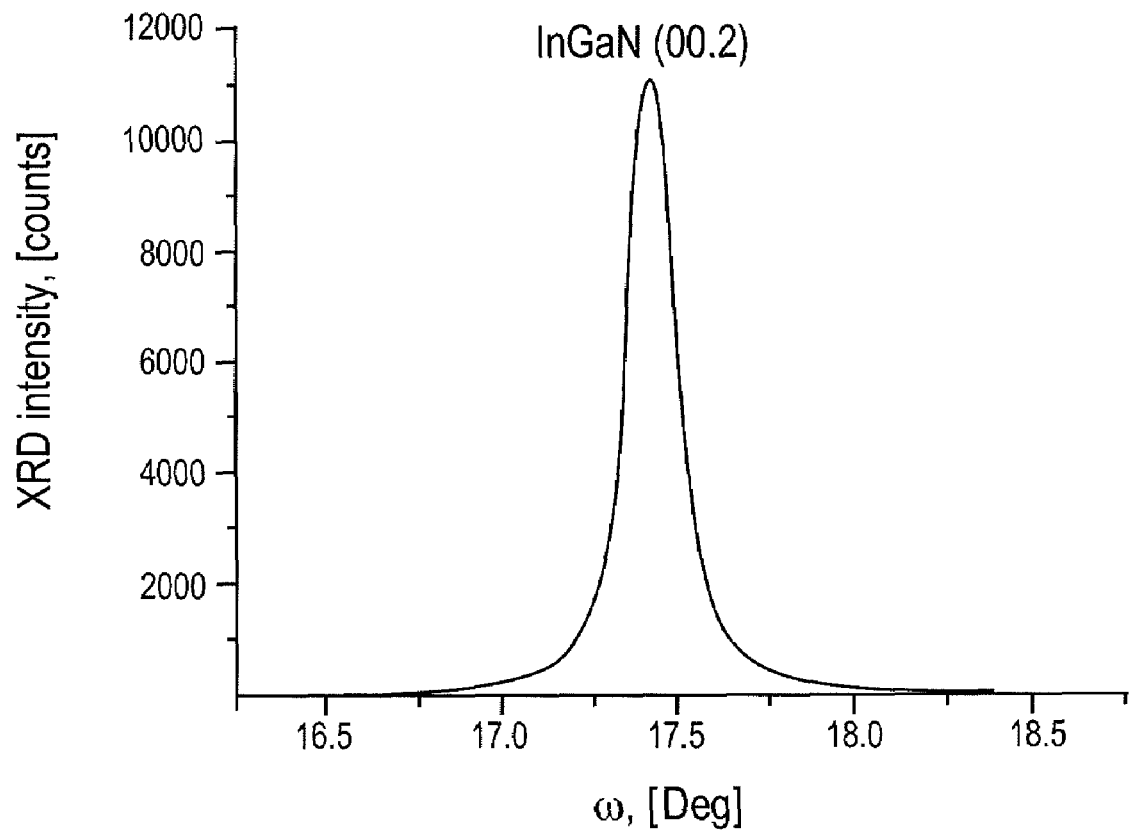
FIG. 23 is a graph showing an x-ray rocking curve using ω-scanning geometry for the (00.2) reflection of a grown InGaN layer.

FIG. 23 shows an x-ray rocking curve using $\omega$-scanning geometry for the (00.2) reflection of a grown InGaN layer 540. X-ray rocking curve full width at half maximum (FWHM) was measured for the (00.2) reflection (FIG. 23) and for the (10.2) reflection (not shown) using $\omega$-scanning geometry. A typical FWHM value for the (00.2) reflection is below 700 arc seconds. The (10.2) InGaN reflection peak FWHM value is less than 3000 arc seconds The narrowest rocking curves for InGaN layers 540 grown on GaN have a FWHM value of about 500 arc seconds for the (00.2) reflection. The InGaN layers 540 grown on AlN templates exhibit wider x-ray rocking curves, e.g. from about 1200 arc seconds to about 2700 arc seconds for the (00.2) reflections, and from about 2600 to about 4500 arc seconds for the (10.2) reflection.

Figure 24:
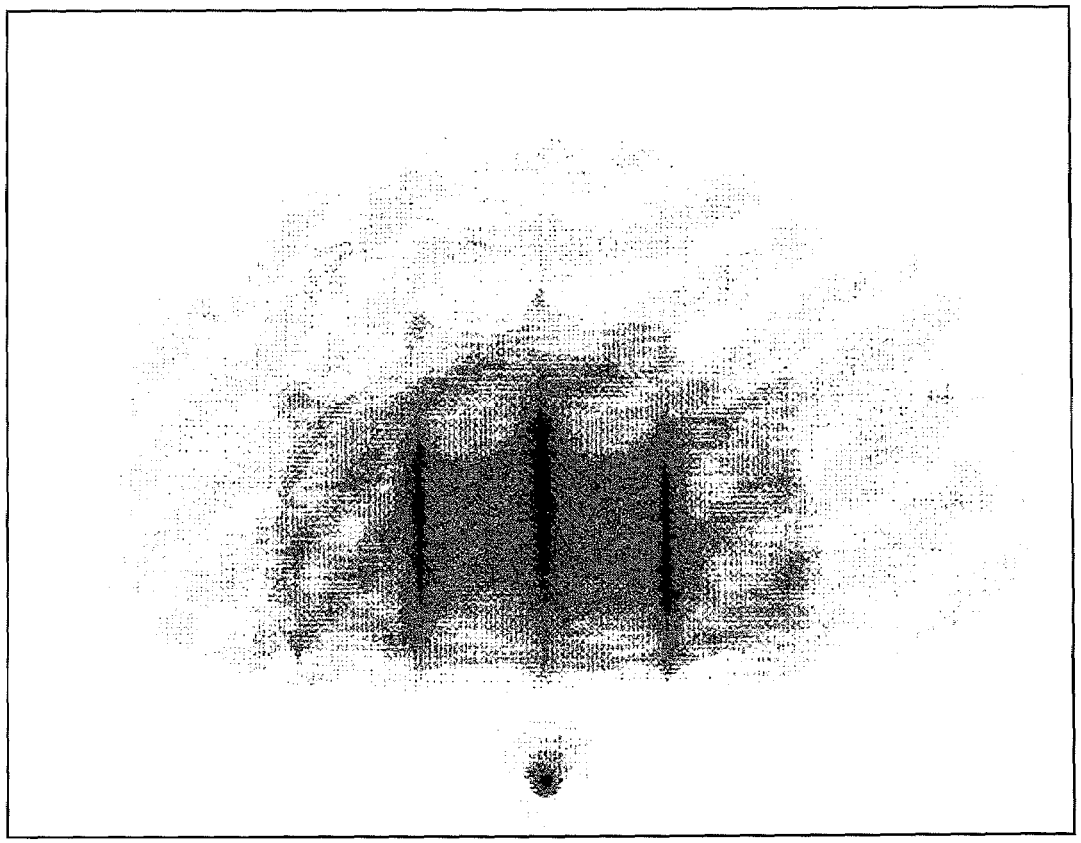
FIG. 24 is a RHEED image illustrating well defined Kikuchi lines and vertical rods indicating high crystalline quality of the as grown surface of an indium gallium nitride layer.

As shown in FIG. 24, surface crystalline structure of the grown layer 540 was studied by reflectance high energy electron diffraction (RHEED), which revealed single crystalline surface. The RHEED image contained well defined Kikuchi lines and vertical rods indicating high crystalline quality of the as grown surface.

Figure 25:
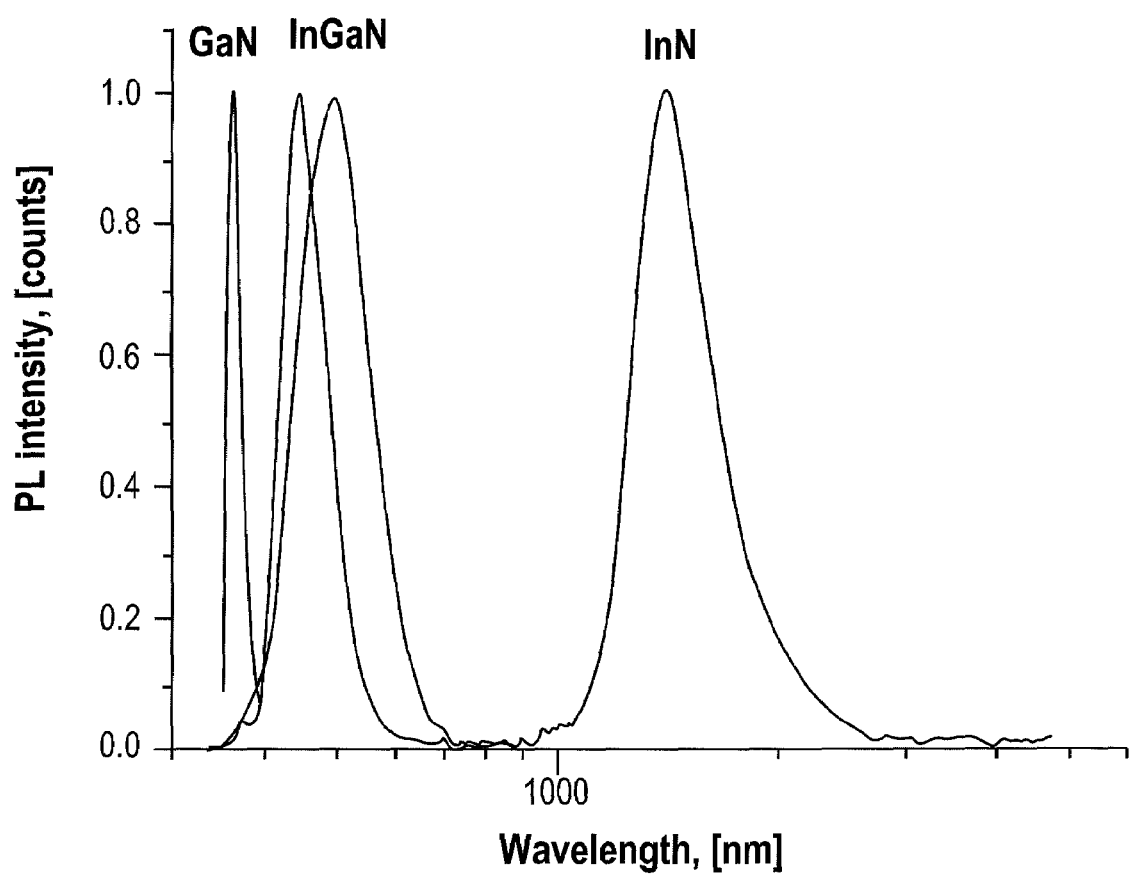
FIG. 25 is a graph illustrating photoluminescence spectra of indium gallium nitride layers with various indium nitride contents.

InGaN materials 540 had n-type conductivity with uncompensated donor concentration from $2\times10^{16}$ to $2\times10^{19}$ cm$^{-3}$. Electrical parameters uniformity for growth on a two inch wafer was better than 10%. The optical band gap is 2.07 eV. Photoluminescence peak positions for InGaN layers 540 grown on GaN, AlN and AlGaN templates varied in a wide wavelength range, for example, from about 430 to 550 nm depending on indium content, as shown in FIG. 25. Compositions of grown InGaN layers 540 were varied through entire composition range from pure InN to pure GaN.

Continuous Growth/Multiple Layers with Different Properties

Figure 26:
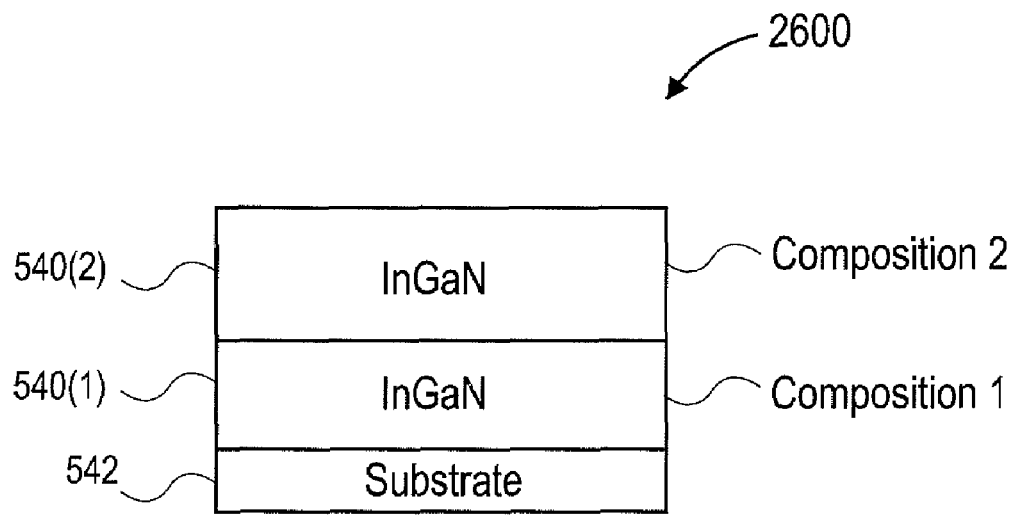
FIG. 26 illustrates an epitaxial structure including two indium gallium nitride layers according to one embodiment.
Figure 27:
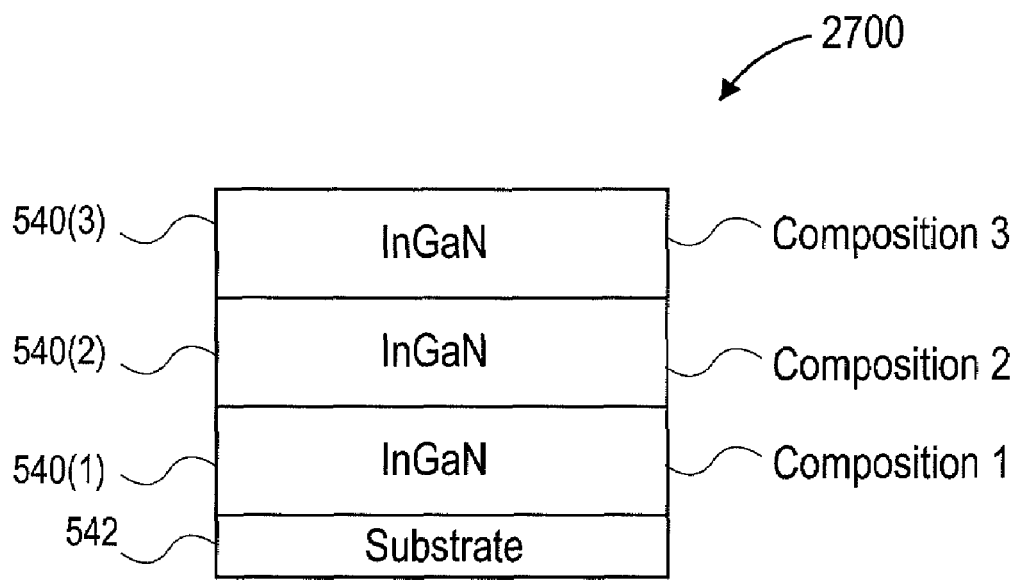
FIG. 27 illustrates an epitaxial structure including three indium gallium nitride layers according to one embodiment.

In another embodiment, multi-layer epitaxial structures including multiple InGaN, InAlN and InAlGaN layers are fabricated with reactor and method embodiments. For example, referring to FIG. 26, a structure 2600 can include two InGaN layers 540(1) and 540(2) on a substrate 542. As a further example referring to FIG. 27 a structure 2700 can include more than two InGaN layers, e.g., InGaN layers 540 (1-3), on a substrate 542. Multiple layers can also form a superstructure for use as, e.g., UV, blue, green, red and white LEDs. In alternative embodiments, a structure can include multiple indium aluminum nitride layers. In a further embodiment, a structure can include multiple indium gallium nitride layers. Thus, FIGS. 26 and 27 are provided to illustrate examples of how embodiments can be used to grow multiple indium gallium nitride layers 540.

Layers 540 of a multi-layer structure can have different compositions and can be formed in separate or the same epitaxial runs. In one embodiment, different layers are formed in a continuous manner, i.e., during the same epitaxial run, by changing the indium content as a layer is grown, thereby defining different layers. In one embodiment, the indium content in grown InGaN layers 540 can be controllably varied from x=0 (pure GaN) to x=1 (pure InN). According to one embodiment, multiple layers having different compositions can be grown on GaN-on-sapphire or AlN-on-sapphire template substrates in a continuous manner by altering indium content. Layers of $In_xGa_{1-x}N$ 540 with improved crystalline parameters and reduced defect density were produced. Thicknesses of the InGaN layers 540 ranged from about 0.001 microns to more than 100 microns, with standard thickness deviation measured to be below 5%. InGaN growth rates were controlled and varied to produce thin layers and thick layers or bulk materials.

Embodiments directed to methods for continuously growing indium gallium nitride 540 while adjusting processing parameters are based on the method shown in FIG. 8 with certain processing parameter adjustments. Thus, method steps in FIG. 8 can be repeated with desired processing parameter adjustments to grow various numbers of layers 540 on a substrate 542.

For example, to grow a first layer 540(1) of InGaN, e.g., with a higher InN content, the source temperature of the liquid $InCl_3$ source material 140 was adjusted to a temperature of about 410°-415° C., and the temperature of a solid $GaCl_3$ source material 242 was adjusted to a temperature of about 20°-30° C. The temperature of the growth zone 130 was adjusted to a first growth temperature of about 650°-675° C. The indium-containing gas product 560 and the gallium-containing gas product 562 resulting from evaporation of the source materials 140 and 242 were carried from the accumulation zone 120 and into the growth zone 130 by a carrier gas, and ammonia was also introduced into the growth zone 130. Significantly, HCl gas 531 was not supplied into the growth zone 130 during growth. The flow of argon gas through an indium source tube ranged from 0.5-10 liters/minute, the flow of argon gas through the gallium source tube ranged from 0.1-0.5 liters/minute, and the flow of argon gas through an ammonia source tube ranged from 1-20 liters/minute. The resulting reaction of the gases 560, 562 and ammonia 535 resulted in growth of a first layer 540(1) of indium gallium nitride on a substrate 542, the first layer 540(1) having a certain indium nitride content. The duration of growth of the first layer 540(1) was 15 to 20 minutes.

To grow a second layer 540(2) of InGaN with lower InN content, the temperature of the vessel 520 in the accumulation zone 120 holding collected liquid $InCl_3$ source material 140 was adjusted to a temperature of about 370°-395° C., and the vessel 522 holding collected solid $GaCl_3$ source material 242 was adjusted to a temperature of about 40°-60° C. The temperature of the growth zone 130 was adjusted to a second growth temperature of about 710°-725° C. The flow of argon gas through the indium source tube now ranged from 0.1-10 liters/minute, the flow of argon gas through the gallium source tube ranged from 0.5-10 liters per minute, and the flow of argon gas through the ammonia source tube ranged from 1-20 liters/minute. The gas products 560 and 562 resulting from evaporation of collected source materials 140 and 242 and ammonia 535 react, thereby resulting in growth of a second layer 540(2) of indium gallium nitride. The duration of growth of the second layer 540(2) was 15-20 minutes. The second layer 540(2) has less indium nitride compared to the first layer 540(1).

Similar adjustments can be made and growth steps shown in FIG. 8 repeated to grow additional InGaN layers 540(n), and the indium content in one or more or all of the grown layers can vary. Implementing temperature adjustments more quickly results in sharper indium content changes in the layer grown. Temperature adjustments can be repeated multiple times, e.g., about five times, resulting in growth of multilayer structures. For example, embodiments can be used to grow five bi-layers (10 layers total). Each bi-layer pair includes a first layer having a first composition and a second layer having a second composition. The total duration of the growth stage when growing multi-layer structures can be about 150-240 minutes. Although embodiments are described with reference to growth of multiple layers of indium gallium nitride 540, similar temperature adjustments and processing steps shown in FIG. 8 can be performed to grow multiple layers of indium aluminum nitride 1801 and indium gallium aluminum nitride 1901.

Further, in one embodiment, to facilitate continuous growth of multiple layers or for bulk material growth, embodiments can include multiple independent chloride source channels for each group III metal so that uninterrupted, long term growth can be performed to produce thick InGaN layers and bulk materials. According to one embodiment, this is done by interleaving generation-accumulation and growth stages. For example, one source channel supplies a group III chloride gas for growth while the generation-accumulation of this group III chloride material occurs in another source channel. Thus, generation/accumulation and growth can occur simultaneously through the use of multiple components and different reactor configurations.

Figure 28:
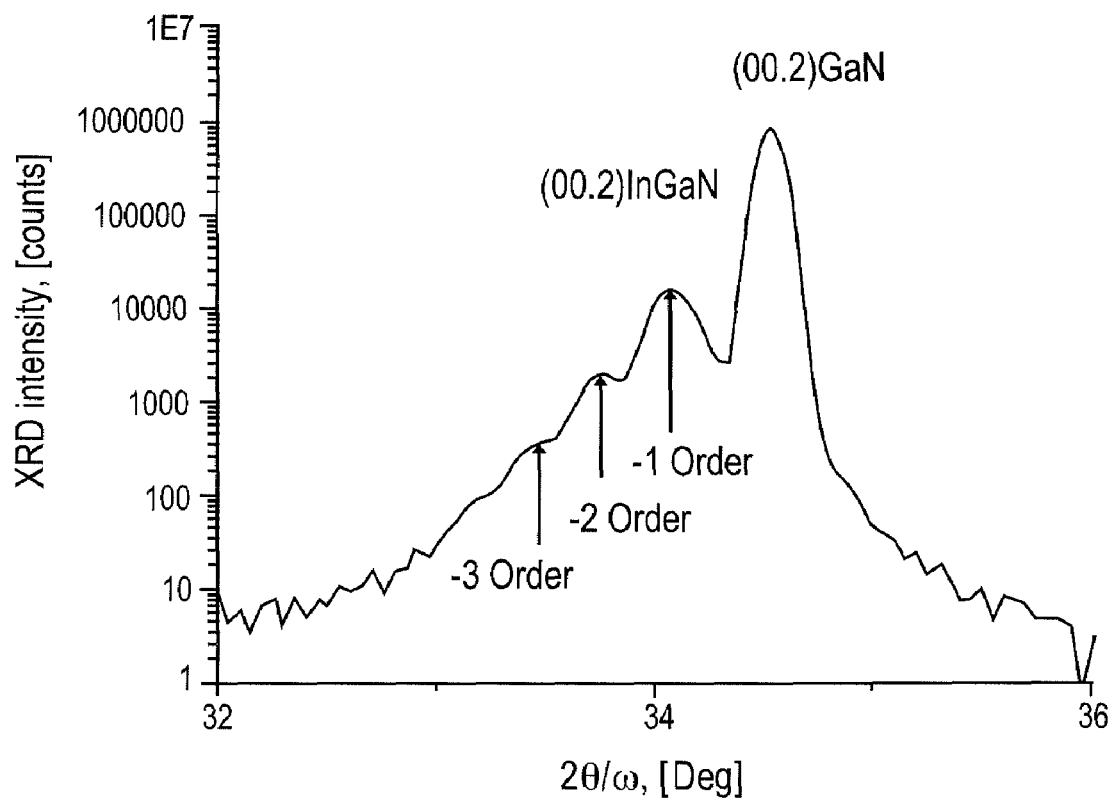
FIG. 28 is a graph of an x-ray diffraction spectrum of an InGaN/InGaN multi-layer structure.

The composition of multiple grown InGaN layers 540 was studied using x-ray diffraction. The diffraction spectra in $2\Theta/\omega$ scanning geometry showed the existence of single crystalline InGaN with two different InN contents (as shown in FIG. 28), possibly having periodic structure (super lattice with the super lattice constant of ~25-30 nm). FIG. 28 is a graph showing an x-ray diffraction spectrum of an InGaN/InGaN multi-layer structure. InGaN layers with two different compositions form a super lattice structure, which is revealed by multiple satellite peaks. The structure has five bi-layers of InGaN with an InN content of about 1% in cladding layers having a thickness of about 12-15 nm and well layers having an InN content of about 14% and a thickness of about 4-6 nm. The surface crystalline structure was studied by reflectance high energy electron diffraction and revealed a single crystalline surface. The RHEED image contained well defined groups of vertical rods indication high crystalline quality of the as grown surface and presence of the periodic superstructure. Grown structures demonstrated visible photoluminescence at room temperature. Depending on cladding and well layers thickness and composition multi-layer InGaN structures demonstrated PL at different wavelength in visible range.

More specifically, $In_xGa_{1-x}N$ layers grown in this manner on a GaN/sapphire template substrate have a full width at half maximum (FWHM) of x-ray (00.2) diffraction peak measured using $\Theta/2\Theta$-scanning geometry was less than 100 arc seconds, and embodiments may be used for growth of layers having FWHM values preferably less than 80 arc seconds. The FWHM of x-ray diffraction rocking curves measured using $\omega$-scanning geometry were less than 600 arc seconds for the (00.2) peak, and embodiments may be used to grow materials having values below 300 arc seconds. Dislocation density in grown InGaN materials was less than $10^9$ cm$^{-2}$ and embodiments may be used to achieve values less than $10^7$ cm$^{-2}$, and more preferably, less than $10^6$ cm$^{-2}$. Dislocations were distributed uniformly in the grown materials, and the grown layers had a smooth mirror like surface. The surface had a single crystalline structure without polycrystalline or amorphous surface layer. Indium inclusions were not detected in the grown materials.

Structures Including Indium Gallium Nitride and Other Materials

FIGS. 29-32 illustrate different structuring including one or more layers grown using reactor and method embodiments and how such layers can be combined with other layers. More example, structures can include single crystalline layers, one or more of which may be indium gallium nitride, indium aluminum nitride or indium aluminum gallium nitride layers grown according to embodiments, and one or more of which may be group III-V compound layers (e.g., GaN, AlN, AlGaN and other layers). Different layers in a structure can differ from other layers in various manners including having different thicknesses, doping, compositions and electrical conductivity. Layers in a structure can be continuous or they can include nano- or microstructures, e.g., for a quantum dot layer.

Figure 29:
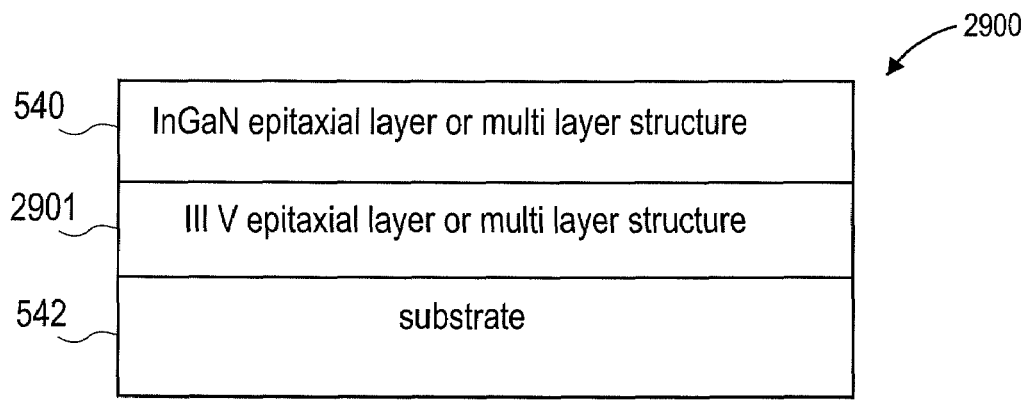
FIG. 29 illustrates an epitaxial structure including an indium gallium nitride layer and a GaN layer grown during a single growth run.

Referring to FIG. 29, a group III-V epitaxial layer or multi-layer structure 2901 is grown on a substrate 542, and an indium gallium nitride epitaxial layer 540 or multi-layer structure (e.g. FIGS. 26 and 27) grown according to embodiments using internally generated and collected source materials is grown on the group III-V layer(s) 2901.

Figure 30:
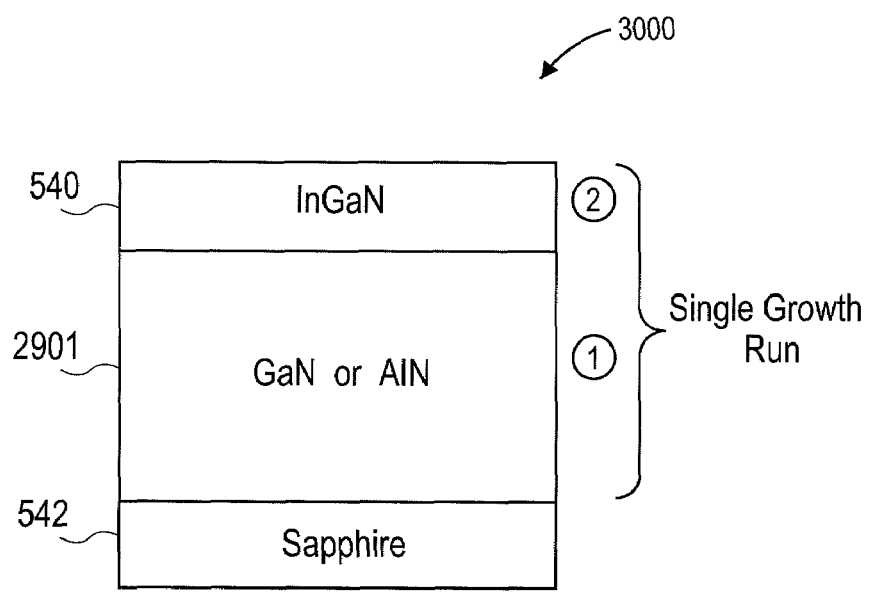
FIG. 30 illustrates an epitaxial structure including an indium gallium nitride layer or multi-layer structure and a group III-V layer or multi-layer structure.

For example, referring to FIG. 30, according to one embodiment, a GaN/InGaN hetero-structure 3000 was grown in a single growth run. More particularly, a first thick GaN layer (or a thick AlN layer) 2901 was grown on a substrate 542 using known HVPE methods. Growth of the thick GaN layer 2901 occurred in a hot wall atmospheric pressure HVPE reactor from metallic gallium using HCl and NH$_3$ active gases and an argon carrier gas. Growth occurred at a temperature between 1000° and 1200° C. The GaN layer 2901 that was grown can be doped with Si to provide a highly conductive n-type material, or with Mg to provide a p-type conductivity layer, or with any other impurity to control layer conductivity. The thickness of the GaN layer 2901 that was grown ranged from 1 to 50 micrometers. After growth of the GaN layer 2901, the temperature in the growth zone 130 was adjusted, and an InGaN layer 540 was grown on the GaN layer 1901. In one embodiment, the temperature in the growth zone 130 for growth of the GaN layer 2901 can be about 1000-1050° C., and the temperature is adjusted to about 500-850° C. for growth of the InGaN layer 540.

Figure 31:
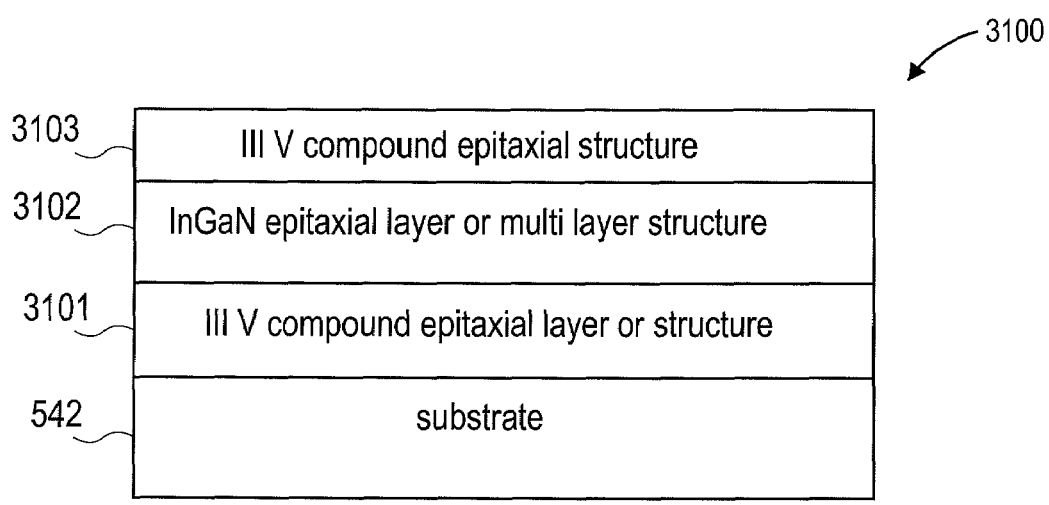
FIG. 31 illustrates an epitaxial structure including an indium gallium nitride layer or multi-layer structure between group III-V layers or structures.

Referring to FIG. 31, in a structure 3100 according to another embodiment, a group III-V layer or structure 3101 can be grown on a substrate 542, an indium gallium component 3102, such as an indium gallium nitride layer 540 or multi-layer structure (FIGS. 26 and 27) can be grown on the layer or structure 3101, and a group III-V compound epitaxial structure 3103 can be grown on the indium gallium component.

Figure 32:
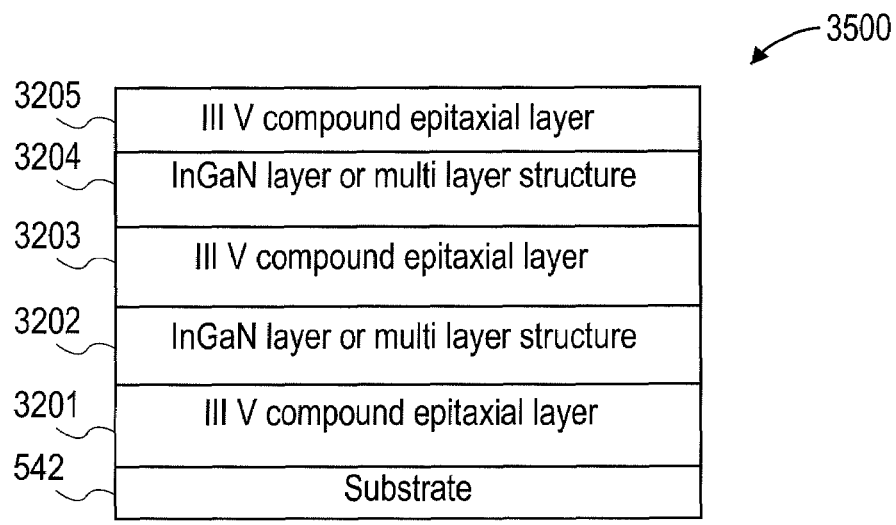
FIG. 32 illustrates an epitaxial structure including multiple indium gallium nitride layer or multi-layer structures and multiple group III-V compound epitaxial layers.

Referring to FIG. 32, in a further embodiment, a structure 3200 includes a group III-V compound epitaxial layer 3201 grown on a substrate 542, an indium gallium nitride component 3202, such as an indium gallium nitride layer 540 or multi layer structure (FIGS. 26 and 26) is grown on the group III-V compound epitaxial layer 3201, a group III-V compound epitaxial layer 3203 is grown on the indium gallium nitride component 3202, and another indium gallium nitride component 3204, such as an indium gallium nitride layer or multi layer structure (FIGS. 26 and 27) is grown on the group III-V compound epitaxial layer 3503, and a group III-V compound epitaxial layer 3205 is grown on the indium gallium nitride component 3204.

Thicknesses of grown indium gallium nitride layers 540 in structures shown in FIGS. 27, 27 and 29-32 can be controlled from a fraction of nanometers to millimeters. Further, the composition of grown layers 540 can be controlled by growth temperatures, flow of carrier gas through indium and gallium source tubes, and temperatures of the sources. With embodiments, the composition of grown layers 540 can vary from 0 mol. % of InN (i.e., pure GaN) to 100 mol. % of InN (i.e., no gallium element) to various InGaN compositions. Further, although embodiments are discussed with reference to indium gallium nitride, the indium gallium nitride layers shown in FIGS. 27, 27, 26, 27 and 29-32 can include one or more indium aluminum nitride layers, one or more indium gallium aluminum nitrides or a combination thereof. Further, structures shown in FIGS. 26 and 27 and 29-32 can include indium gallium nitride in combination with indium aluminum nitride and/or indium gallium aluminum nitride. Thus, FIGS. 26, 27 and 29-32 are provided to illustrate examples of structures that can be fabricated using reactor and method embodiments.

Multi Quantum Well Structures and Devices

Periodic structures including InGaN/InGaN and InGaN/GaN Multi Quantum Wells (MQW) were grown using reactor and method embodiments and with structures generally illustrated in FIG. 27. A periodic structure of a MQW can include a layer having a certain composition and thickness that appears regularly interleaved or alternates with another repeating layer, which has a different composition, and possibly a repeating thickness. The combined thickness of two repeating layers is referred to a period of a super lattice.

In other words, a multi-layer structure of a MQW grown using reactor and method embodiments can have repeating interleaved or alternating structure in which a first layer 549 (1) grown on a substrate 542 has a first thickness and a first composition (e.g., first InN content), a second layer 540(2) grown on the first layer 540 (1) may have the same or different thickness (first or second thickness) and a second composition (e.g., second InN content. A third layer 540(3) grown on the second layer 540(2) is the same as the first layer 540(1), i.e. the third layer 540(3) has the first thickness and the first composition. A fourth layer 540(4) grown on the third layer 540(3) is the same as the second layer 540(2), i.e., the fourth layer 540(4) may have the first or second thickness and the second composition. A fifth layer 540(5) grown on the fourth layer 540(4) is the same as the first and third layers 540(1) and 540(3), i.e., the fifth layer 540(5) has the first thickness and the first composition. Additional layers can be fabricated as needed.

MQWs can be fabricated with two or more different layers 540 arranged in a periodic or interleaved configuration. For example, MQWs often include two different layers, but may also include three different layers, four different layers, and other numbers of layers, e.g., several hundred different layers. Further, although the above example describes a MQW including multiple InGaN layers, MQWs can also be fabricated of other materials grown using reactor and method embodiments. Accordingly, the above description involving five layers is provided as an example of the interleaved/alternating layer structure.

For example, sequences of several pairs of InGaN/InGaN layers 540 having the same thicknesses and different compositions were grown. Multiple layers having different InGaN compositions had thicknesses ranging from a fraction of a nanometer to 100 nanometers with two different InGaN compositions. In certain cases, the InN content in InGaN barrier layers of the super lattice was about 1%, and the InN content in well layers was about 14%. In this example, the thickness of the barrier layers was about 12 nm and thickness of the well layers was about 4 nm, resulting in a super lattice period of about 16 nm.

Figure 33:
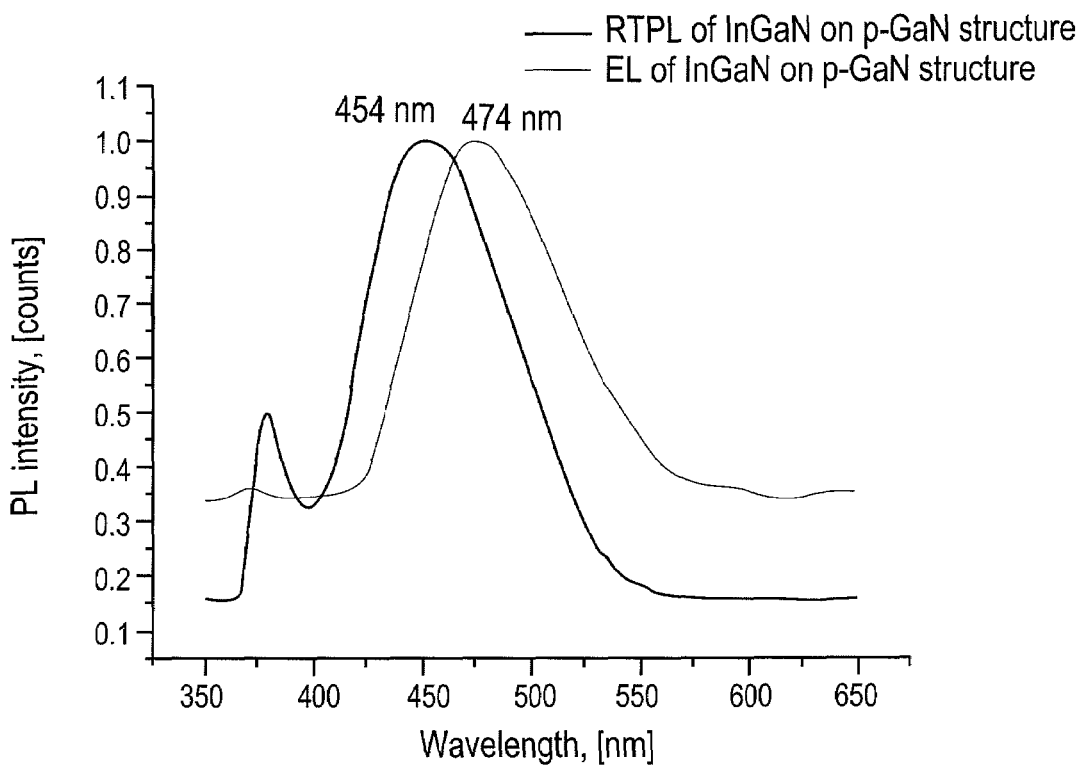
FIG. 33 is a graph illustrating PL and EL data of InGaN/p-GaN hetero-structure.
Figure 34:
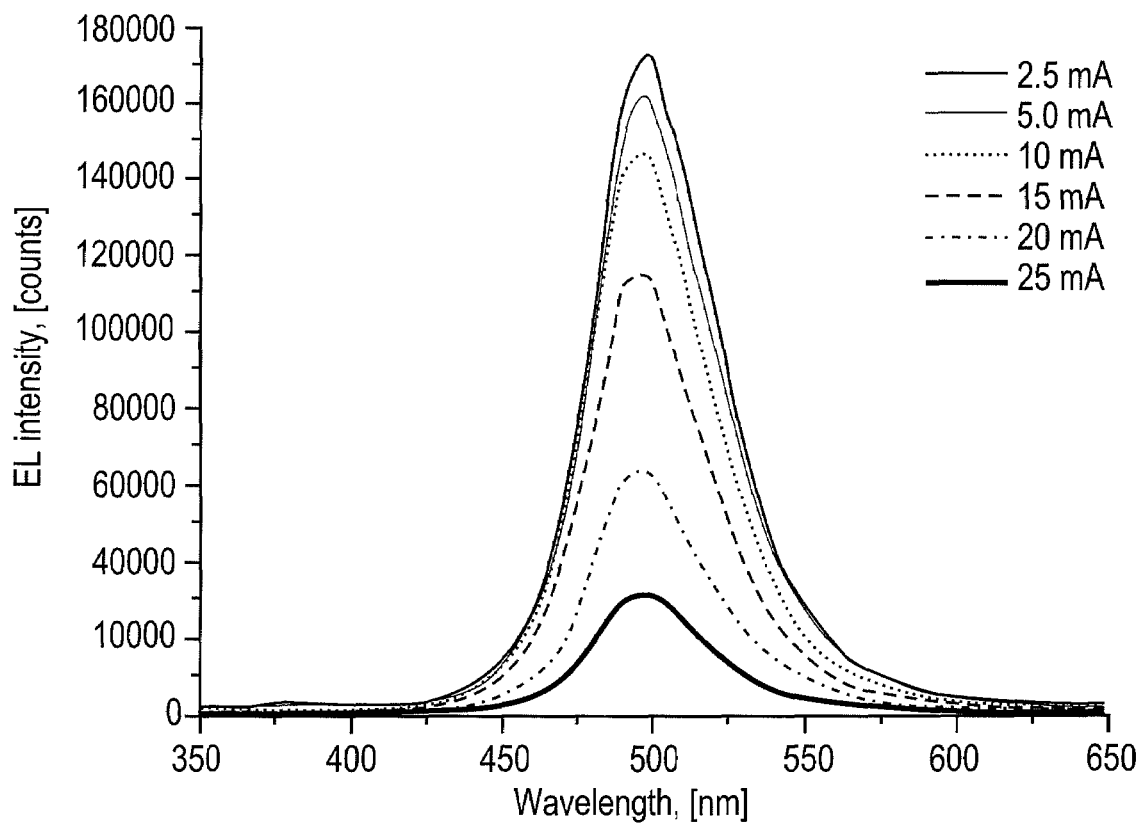
FIG. 34 is a graph illustrating blue EL of InGaN/p-GaN hetero-junction.
Figure 35:
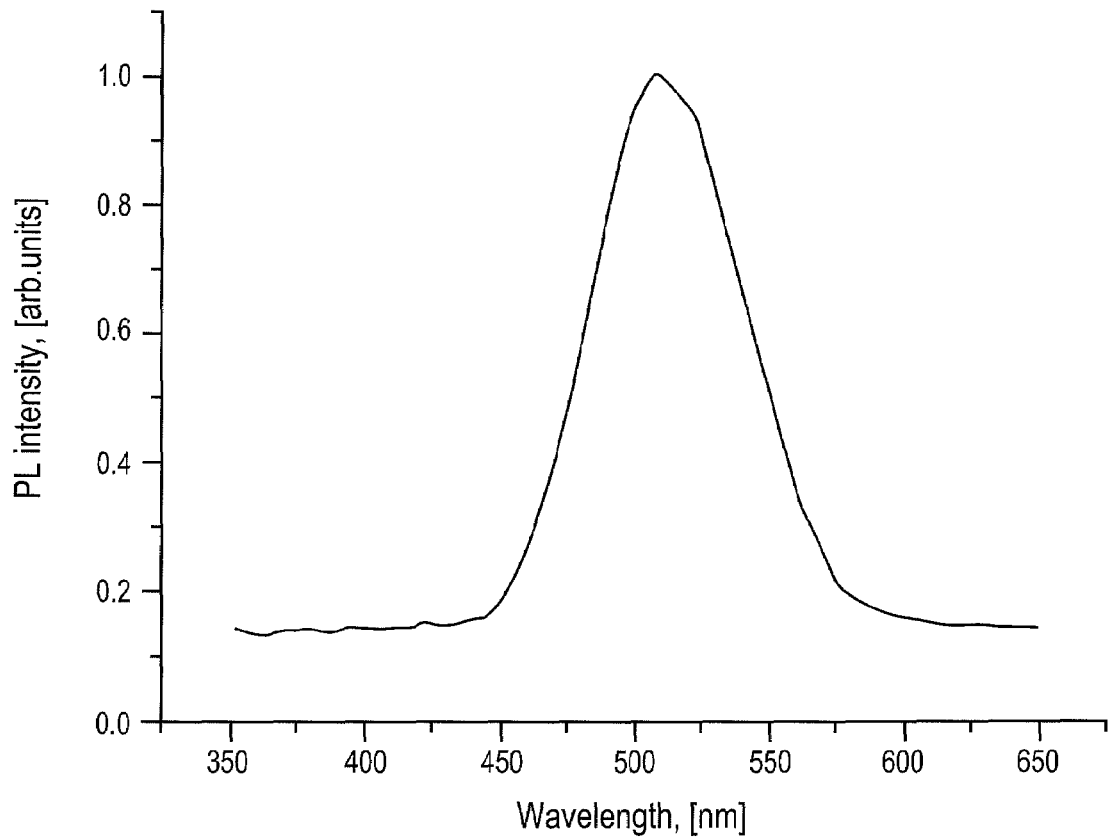
FIG. 35 is a graph illustrating green EL normalized spectrum of InGaN/p-GaN.

MQW structures were grown as described with reference to FIGS. 7-15 on a p-GaN-on-sapphire or a p-GaN-on-n-GaN-on-sapphire template. The p-type layer preferably has a free hole concentration above $5 \times 10^{17}$ cm$^{-3}$, preferably above $10^{18}$ cm$^{-3}$. N-type layers may be undoped or doped depending on desired device application. Certain grown Some n-type layers had free electron concentrations above $10^{18}$ cm$^{-3}$. In one embodiment, growth of indium gallium nitride using source materials generated and collected inside a HVPE reactor was used to form a p-GaN-n-InGaN MQW light emitting diode structure. The p-n hetero-structures that were formed by p-GaN and n-InGaN MQW structures demonstrated effective electroluminescence under the direct bias in blue and green range of spectrum depending on InGaN MQW structure and composition. The maximum of EL was in the range from 420 to 510 nm, depending on layers structure and content (as shown in FIGS. 33-35).

Apparatus and fabrication method embodiments and the resulting materials that are grown provide a number of advantages and improvements over known systems and methods that only use pre-synthesized source materials with contaminant levels that limit their applications. With embodiments, internally generated and collected group III source materials can be defined exclusively by initial source materials (e.g., metallic indium, metallic gallium and halogen gas source) resulting in growth of materials with significantly enhanced purity compared to other known materials. Embodiments also provide control over processing parameters to prevent formation of metallic droplets or inclusions in grown materials. Further, HCl gas is not present in the growth zone during growth, which is beneficial because HCl gas etches off growing materials. Further, group III source materials that are internally generated and collected can be moved within the reactor to supply corresponding group III-containing species during the growth. Additionally, embodiments can be used for growth of epitaxial layers, bulk growth, and growth of various multi-layer and heterogeneous structures and devices can be fabricated using embodiments.

Although particular embodiments of the present invention have been shown and described, it should be understood that the above discussion is not intended to limit the present invention to these embodiments. Persons skilled in the art will appreciate that various changes and modifications may be made without departing from the spirit and scope of embodiments of the invention. Thus, embodiments are intended to cover alternatives, modifications, and equivalents that may fall within the scope of embodiments as defined by the claims.

What is claimed is:

1. A method of growing an epitaxial layer in a hydride vapor phase epitaxy reactor, the method comprising:
    generating a first source material having a compound including indium, the first source material being generated inside the reactor;
    collecting the first source material inside the reactor, the first source material comprising a liquid source material containing indium;
    generating a second source material having a compound including gallium, the second source material being generated inside the reactor;
    collecting the second source material inside the reactor; and
    growing an epitaxial layer including indium and gallium using collected first and second source materials.

2. The method of claim 1, generating the first source material comprising condensing a gas that is a product of a reaction of a reactive gas and indium.

3. The method of claim 1, collecting the second source material comprising collecting a solid source material containing gallium.

4. The method of claim 1, growing the epitaxial layer comprising growing an indium gallium nitride epitaxial layer.

5. The method of claim 1, generating and collecting the first source material comprising generating and collecting a first source material containing InCl$_3$, and generating and collecting the second source material comprising generating and collecting a source material containing GaCl$_3$.

6. The method of claim 1, the first source material being collected in a first container, and the second source material being collected inside a second container.

7. The method of claim 6, further comprising moving at least one of the containers from a first position inside the reactor to a second position inside the reactor.

8. The method of claim 1, wherein growth is performed in the absence of hydrogen chloride gas.

9. A method of growing an epitaxial layer in a hydride vapor phase epitaxy reactor, the method comprising:
    generating a first gas product resulting from a reaction of a first reactive gas and indium;
    generating a liquid source material having a compound including indium, the liquid source material being generated inside the reactor by condensation of the first gas product;
    collecting the liquid source material in a vessel positioned inside the reactor;
    evaporating collected liquid source material; and
    growing an epitaxial layer including indium and at least two other elements by a reaction of a second reactive gas and a second gas product resulting from evaporation of collected liquid source material.

10. A method of growing an epitaxial layer in a hydride vapor phase epitaxy reactor, the method comprising:
    generating a first gas product resulting from a reaction of a first reactive gas and indium;
    generating a second gas product resulting from a reaction of the first reactive gas and gallium;
    generating a liquid first source material having a compound including indium, the liquid first source material being generated inside the reactor by condensation of the first gas product;
    generating a solid second source material having a compound including gallium, the solid second source material being generated inside the reactor by condensation of the second gas product;
    collecting the liquid first source material in a first vessel positioned inside the reactor;
    collecting the solid second source material in a second vessel positioned inside the reactor;
    evaporating collected first source material, thereby generating a third gas product;
    evaporating collected second source material, thereby generating a fourth gas product; and
    growing an epitaxial layer by a reaction of a second reactive gas and the third and fourth gas products.

11. The method of claim 9, growing the epitaxial layer comprising growing indium gallium nitride.

12. The method of claim 10, growing the epitaxial layer comprising growing indium gallium nitride.

13. The method of claim 9, wherein a full width at half maximum (FWHM) of an x-ray ω-scan rocking curve for the epitaxial layer is less than 800 arc seconds for a (00.2) peak.

14. The method of claim 10, wherein a full width at half maximum (FWHM) of an x-ray ω-scan rocking curve for the epitaxial layer is less than 800 arc seconds for a (00.2) peak.

15. The method of claim 9, wherein the epitaxial layer is indium aluminum nitride or indium gallium aluminum nitride.

16. The method of claim 10, wherein the epitaxial layer is indium aluminum nitride or indium gallium aluminum nitride.

17. The method of claim 9, wherein the liquid source material that is collected comprises $InCl_3$.

18. The method of claim 10, wherein the liquid first source material that is collected comprises $InCl_3$.

19. The method of claim 9, further comprising moving the vessel having collected source material from a first position inside the reactor to a second position inside the reactor.

20. The method of claim 10, further comprising moving at least one of the first vessel and the second vessel from a first position inside the reactor to a second position inside the reactor.

21. The method of claim 9, wherein growth is performed in the absence of hydrogen chloride gas.

22. The method of claim 10, wherein growth is performed in the absence of hydrogen chloride gas.

* * * * *